United States Patent
Her et al.

(10) Patent No.: US 11,107,538 B2
(45) Date of Patent: Aug. 31, 2021

(54) STORAGE DEVICE AND OPERATING METHOD THEREOF

(71) Applicant: SK hynix Inc., Gyeonggi-do (KR)

(72) Inventors: Min Ho Her, Chungcheongbuk-do (KR); Dong Hyun Kim, Gyeonggi-do (KR); Seung Il Kim, Chungcheongbuk-do (KR); Yong Ho Kim, Chungcheongbuk-do (KR); Jae Min Lee, Chungcheongbuk-do (KR); Seon Young Choi, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/134,786

(22) Filed: Dec. 28, 2020

(65) Prior Publication Data
US 2021/0118515 A1   Apr. 22, 2021

Related U.S. Application Data

(63) Continuation of application No. 16/238,256, filed on Jan. 2, 2019, now Pat. No. 10,910,070.

(30) Foreign Application Priority Data

Jun. 20, 2018 (KR) .................. 10-2018-0071090

(51) Int. Cl.
G11C 16/08 (2006.01)
G11C 16/28 (2006.01)
G11C 16/16 (2006.01)
G11C 11/56 (2006.01)
G11C 16/34 (2006.01)
G06F 12/02 (2006.01)
G06F 3/06 (2006.01)
G06F 12/0866 (2016.01)

(52) U.S. Cl.
CPC ............ *G11C 16/28* (2013.01); *G06F 3/0659* (2013.01); *G06F 3/0679* (2013.01); *G06F 12/0246* (2013.01); *G06F 12/0866* (2013.01); *G11C 11/5642* (2013.01); *G11C 16/08* (2013.01); *G11C 16/16* (2013.01); *G11C 16/34* (2013.01)

(58) Field of Classification Search
CPC ...................................................... G11C 16/08
USPC .................................................... 365/189.15
See application file for complete search history.

(56) References Cited

U.S. PATENT DOCUMENTS

2009/0222617 A1 * 9/2009 Yano .................. G06F 3/0614
711/103

* cited by examiner

*Primary Examiner* — Jason Lappas
(74) *Attorney, Agent, or Firm* — IP & T Group LLP

(57) ABSTRACT

The present disclosure relates to an electronic device. A storage device includes a memory device configured to include a plurality of memory cells and a memory controller configured to determine a read voltage for a read operation to be performed on the memory device according to whether the read operation is a cache read operation.

20 Claims, 17 Drawing Sheets

STORAGE DEVICE AND OPERATING METHOD THEREOF

CROSS-REFERENCE TO RELATED APPLICATION

This application is a continuation of U.S. patent application Ser. No. 16/238,256 filed on Jan. 2, 2019, which claims benefits of priority of Korean Patent Application No. 10-2018-0071090 filed on Jun. 20, 2018. The disclosure of each of the foregoing application is incorporated herein by reference in its entirety.

BACKGROUND

Field of Invention

Various embodiments of the present invention generally relate to an electronic device. Particularly, the embodiments relate to a storage device and an operating method thereof.

Description of Related Art

A storage device may store data in response to control of a host device such as a computer, a smartphone, and a smartpad. Examples of the storage device may include a device for storing data in a magnetic disk, such as a hard disk drive (HDD), and a device for storing data in a semiconductor memory, especially in a nonvolatile memory, such as a solid state drive (SSD) or a memory card.

A storage device may include a memory device storing data and a memory controller controlling the memory device. A memory device may be classified into a volatile memory and a nonvolatile memory. Nonvolatile memories may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM).

SUMMARY

Various embodiments are directed to a storage device performing a read operation by a read voltage, which is set according to environment where the read operation is performed, and an operating method thereof.

According to an embodiment, a storage device may include a memory device including a plurality of memory cells, and a memory controller determining a read voltage for a read operation to be performed on the memory device according to whether the read operation is a cache read operation.

According to an embodiment, a storage device may include a memory device configured to include including a plurality of memory cells; and a memory controller configured to determine a read voltage for a read operation to be performed on selected memory cells, among the plurality of memory cells, according to environments when the read operation is performed on the selected memory cells, wherein the memory controller includes a management table that stores environment information representing environments of the plurality of memory cells, and wherein the memory controller determines the read voltage based on the environment information.

According to an embodiment, a method of operating a storage device including a memory controller controlling a memory device including a plurality of memory cells may include receiving a read request with respect to selected memory cells, among the plurality of memory cells, determining a read voltage to be provided to the selected memory cells according to an environment where a read operation corresponding to the read request is performed, and performing the read operation using the read voltage.

According to an embodiment, a memory system may include a memory device including memory cells; a storage storing at least one piece of information representing: whether a read operation to be performed is a cache read operation; elapsed time after completion of a previous program operation; temperature of the memory cells during the previous program operation; and whether a target memory block of the read operation is an unselected block during a previous operation; a read voltage determiner determining a read voltage for the read operation by referring to the information and selectively based on temperature of the memory cells during the read operation; and a read operation controller controlling the memory device to perform the read operation with the determined read voltage, wherein the information is stored in the storage on a basis of physical addresses of the memory cells.

DETAILED DESCRIPTION

Figure 1:
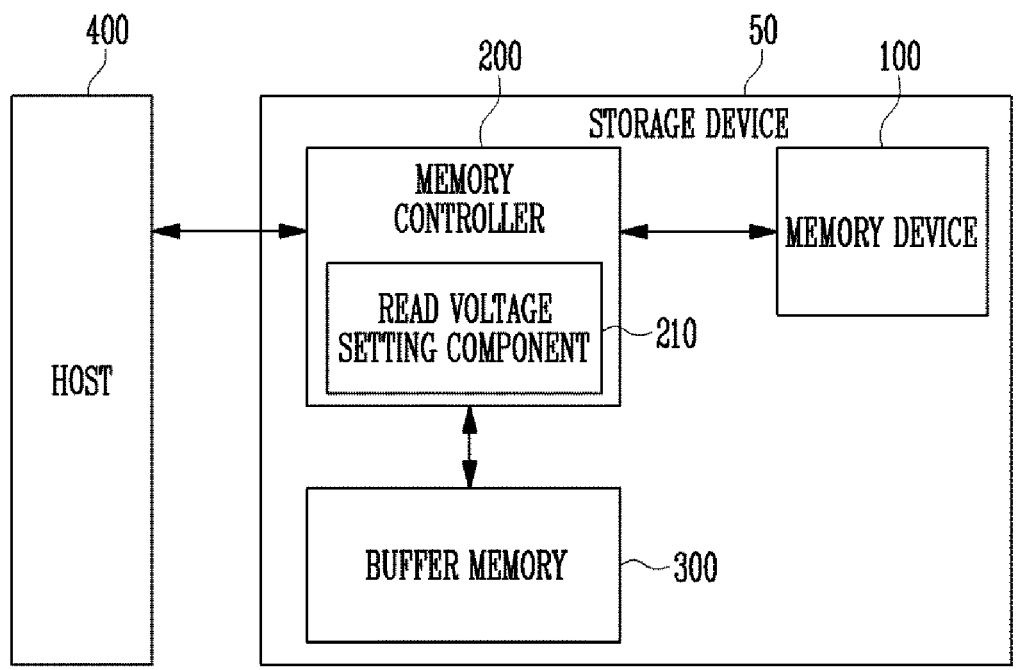
FIG. 1 is a diagram illustrating a storage device according to an embodiment.

Hereinafter, specific structural or functional descriptions herein is merely for the purpose of describing embodiments of the present disclosure. However, embodiments can be modified in various ways or implemented in various forms, and thus the present invention is not to be construed as limited to the embodiments set forth herein. Rather, the present invention encompasses changes, modifications, and/or substitutions that do not depart from the spirit and technical scope of the present disclosure.

Moreover, throughout the specification, reference "to an embodiment" or the like is not necessarily to only one embodiment, and different references to "an embodiment" or the like are not necessarily to the same embodiment(s).

While terms such as "first" and "second" may be used to identify various components, such components are not limited by such identifiers. The above terms are used to distinguish one component from another component that otherwise have the same or similar names. For example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms and vice versa, unless the context clearly indicates otherwise. In the present specification, it should be understood that terms "include/including" or "have/having," and the like, are intended to indicate the existence of the stated feature, a number, a step, an operation, a component, a part or the combination those of described in the specification is present, but do not exclude a possibility of presence or addition of one or more other features, numbers, steps, operations, components, parts or combinations thereof.

So far as not being differently defined, all terms used herein including technical or scientific terminologies have meanings that they are commonly understood by those skilled in the art to which the present disclosure pertains. The terms defined in generally used dictionaries should be interpreted as having the same meanings as would be construed in the context of the related art, and unless clearly defined otherwise in this specification, should not be interpreted as having idealistic or overly formal meanings.

In describing these embodiments, description of techniques that are well known in the art to which the present disclosure pertains and not directly related to the present disclosure are omitted. Such omission facilitates more clear presentation of the elements and features of the present disclosure.

Hereinafter, exemplary embodiments of the present disclosure will be described in detail with reference to the accompanying drawings in order for those skilled in the art to be able to readily implement the technical spirit of the present disclosure.

FIG. 1 is a diagram illustrating a storage device 50 according to an embodiment.

Referring to FIG. 1, the storage device 50 may include a memory device 100, a memory controller 200, and a buffer memory 300.

The storage device 50 may be configured to store data in response to a host 400. Non-limiting examples of the storage device 50 may include a cellular phone, a smartphone, an MP3 player, a laptop computer, a desktop computer, a game player, a TV, a tablet PC, or an in-vehicle infotainment system.

The storage device 50 may be configured as one of various types of storage devices depending on a host interface which is a communication method with the host 400. For example, the storage device 50 may be configured as any one of various kinds of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card International association (PCMCIA) card type storage device, a peripheral component interconnection (PCI) card type storage device, a PCI express (PCI-e or PCIe) card type storage device, a compact flash (CF) card, a smart media card, a memory stick, and the like.

The storage device 50 may be manufactured by any one of various types of packages. For example, the storage device 50 may be manufactured by any one of various kinds of package types, such as a package-on-package (POP), a system-in-package (SIP), a system-on-chip (SOC), a multi-chip package (MCP), a chip-on-board (COB), a wafer-level fabricated package (WFP), a wafer-level stack package (WSP) and the like.

The memory device 100 may store data. The memory device 100 may operate under the control of the memory controller 200. The memory device 100 may include a memory cell array (not shown) including a plurality of memory cells storing data. The memory cell array may include a plurality of memory blocks. Each of the memory blocks may include a plurality of memory cells. Each memory block may include a plurality of pages. According to an embodiment, a page may be a unit for storing data in the memory device 100 or reading data stored in the memory device 100. The memory block may be a unit for erasing data.

By way of example and not limitation, the memory device 100 may be a Double Data Rate Synchronous Dynamic Random Access Memory (DDR SDRAM), a Low Power Double Data Rate4 (LPDDR4) SDRAM, a Graphics Double Data Rate (GDDR) SDRAM, Low Power DDR (LPDDR), a Rambus Dynamic Random Access Memory (RDRAM), a NAND flash memory, a vertical NAND, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM). For convenience of explanation, it is assumed that the memory device 100 is a NAND flash memory.

According to an embodiment, the memory device 100 may have a two-dimensional (2D) or a three-dimensional (3D) array structure. The present disclosure may be applied not only to a flash memory in which a charge storage layer includes a conductive floating gate (FG), but also to a charge trap flash (CTF) memory in which a charge storage layer includes an insulating layer.

According to an embodiment, each of the memory cells included in the memory device 100 may be a single level cell (SLC) storing one data bit. Alternatively, each of the memory cells of the memory device 100 may be configured as a multi-level cell (MLC) for storing two data bits, a triple level cell (TLC) for storing three data bits, or a quad level cell (QLC) for storing four data bits.

The memory device 100 may receive a command and an address from the memory controller 200 and access an area selected in response to the address in the memory cell array. That is, the memory device 100 may perform an operation corresponding to the command on the region selected in response to the address. For example, the memory device 100 may perform a write operation (program operation), a read operation, and an erase operation. During a program operation, the memory device 100 may program the area selected by the address with data. During a read operation, the memory device 100 may read data from the area selected by the address. During an erase operation, the memory device 100 may erase data from the area selected by the address.

The memory controller 200 may control general operations of the storage device 50.

When power is applied to the storage device 50, the memory controller 200 may execute firmware FW. When the memory device 100 is a flash memory device, the memory controller 200 may operate firmware such as a Flash Translation Layer (FTL) for controlling communication between the host 400 and the memory device 100.

According to an embodiment, the memory controller 200 may receive data and a logical block address from the host 400 and convert the logical block address into a physical block address indicating an address of memory cells in the memory device 100 in which data is stored. In addition, the memory controller 200 may store a logical-physical address mapping table configuring a mapping relationship between the logical block address and the physical block address in the buffer memory 300.

The memory controller 200 may control the memory device 100 so that a program operation, a read operation or an erase operation may be performed in response to a request from the host 400. During a program operation, the memory controller 200 may provide a program command, a physical address, and data to the memory device 100. During a read operation, the memory controller 200 may provide a read command and a physical address to the memory device 100. During an erase operation, the memory controller 200 may provide an erase command and a physical address to the memory device 100.

According to an embodiment, the memory controller 200 may autonomously generate a program command, an address, and data without receiving a request from the host 400, and may transmit them to the memory device 100. For example, the memory controller 200 may provide a command, an address, and data to the memory device 100 to perform background operations, such as a program operation for wear leveling and a program operation for garbage collection.

The memory controller 200 may include a read voltage setting component 210. The memory controller 200 may receive a read request from the host 400 and provide a read command corresponding to the read request to the memory device 100. The memory device 100 may perform a read operation in response to the read command. The read operation may be an operation of obtaining data stored in an area selected by an address using at least one read voltage.

Data stored in memory cells may be identified depending on threshold voltages of memory cells. The threshold voltages of the memory cells may be changed by various factors. For example, threshold voltages of memory cells may be changed when a read operation is performed. Therefore, when a read operation is performed using predetermined default read voltages, the probability of occurrence of errors may be increased. According to an embodiment of the present invention, the read voltage setting component 210 may control the memory device 100 to determine an optimal read voltage according to the environment where a read operation is performed, and to perform the read operation using the determined read voltage.

According to an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store the data input from the host 400 and transmit the data temporarily stored in the buffer memory device 300 to the memory device 100.

According to various embodiments, the buffer memory 300 may serve as an operation memory or a cache memory. The buffer memory 300 may store codes or commands executed by the memory controller 200. Alternatively, the buffer memory 300 may store data processed by the memory controller 200.

According to an embodiment, by way of example and not limitation, the buffer memory 300 may include a dynamic random access memory (DRAM), such as Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), or Rambus Dynamic Random Access Memory (RDRAM), or a static random access memory (SRAM).

According to various embodiments, the storage device 50 may not include the buffer memory 300. However, nonvolatile memory devices outside the storage device 50 may function as the buffer memory 300.

According to various embodiments, the buffer memory 300 may be included in the memory controller 200.

According to an embodiment, the memory controller 200 may control at least two memory devices 100. The memory controller 200 may control the memory devices 100 according to an interleaving scheme to improve operation performance.

The host 400 may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
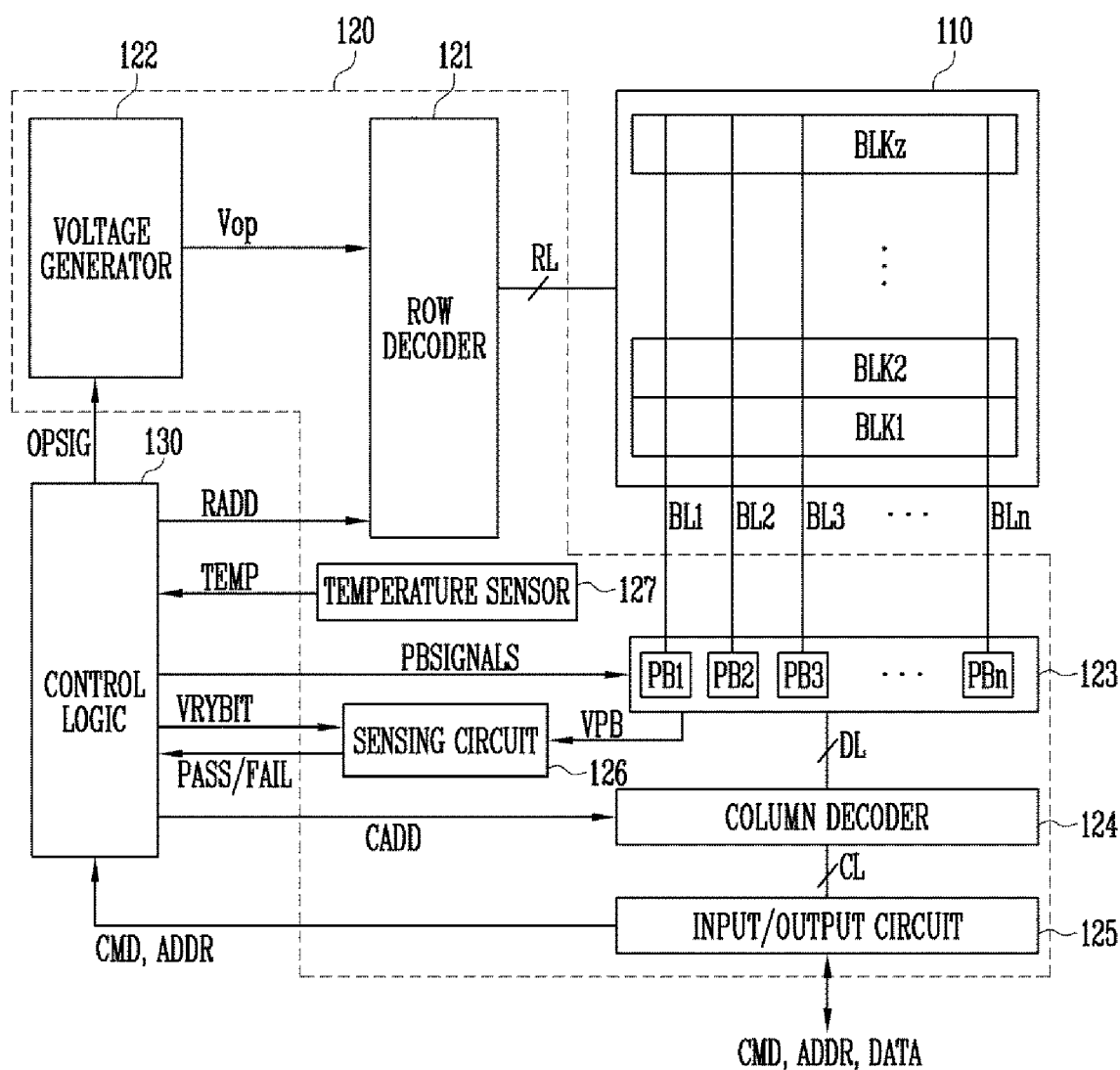
FIG. 2 is a diagram illustrating the structure of a memory device shown in FIG. 1.

FIG. 2 is a diagram illustrating the structure of the memory device 100 shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to a row decoder 121 through row lines RL. The memory blocks BLK1 to BLKz may be coupled to a page buffer group 123 through bit lines BL1 to BLm. Each of the plurality of memory blocks BLK1 to BLKz may include a plurality of memory cells. In an embodiment, the plurality of memory cells may be nonvolatile memory cells. Memory cells coupled to the same word line may be defined as one page. Therefore, each memory block may include a plurality of pages.

The row lines RL may include at least one source selection line, a plurality of word lines, and at least one drain selection line.

Each of the memory cells included in the memory cell array 110 may include a single-level cell (SLC) storing a single data bit, a multi-level cell (MLC) storing two data bits, a triple-level cell (TLC) storing three data bits, or a quad-level cell (QLC) storing four data bits.

The peripheral circuit 120 may be configured to perform program, read and erase operations on the selected area of the memory cell array 110 in response to control of the control logic 130. The peripheral circuit 120 may drive the memory cell array 110. For example, the peripheral circuit 120 may apply various operating voltages to the row lines RL and the bit lines BL1 to BLn, or discharge the applied voltages in response to control of the control logic 130.

The peripheral circuit 120 may include the row decoder 121, a voltage generator 122, the page buffer group 123, a column decoder 124, a data input/output circuit 125, a sensing circuit 126, and a temperature sensor 127.

The row decoder 121 may be coupled to the memory cell array 110 through the row lines RL. The row lines RL may include at least one source selection line, a plurality of word lines, and at least one drain selection line. In an embodiment, the word lines may include normal word lines and dummy word lines. According to an embodiment, the row lines RL may further include a pipe selection line.

The row decoder 121 may be configured to operate in response to control of the control logic 130. The row decoder 121 may receive a row address RADD from the control logic 130.

The row decoder 121 may be configured to decode the row address RADD. The row decoder 121 may select at least one memory block among the memory blocks BLK1 to BLKz according to the decoded block address. The row decoder 121 may select at least one word line of the selected memory block to apply voltages generated by the voltage generator 122 to at least one word line WL according to the decoded address.

For example, during a program operation, the row decoder 121 may apply a program voltage to the selected word line and a pass voltage having a lower voltage level than the program voltage to unselected word lines. During a program verify operation, the row decoder 121 may apply a verify voltage to the selected word line and a verify pass voltage greater than the verify voltage to the unselected word lines. During a read operation, the row decoder 121 may apply a read voltage to the selected word line and a read pass voltage greater than the read voltage to the unselected word lines.

According to an embodiment, an erase operation of the memory device 100 may be performed in units of memory blocks. During an erase operation, the row decoder 121 may select one of the memory blocks according to the decoded address. During the erase operation, the row decoder 121 may apply a ground voltage to word lines coupled to the selected memory block.

The voltage generator 122 may be controlled by the control logic 130. The voltage generator 122 may be configured to generate a plurality of voltages by using an external power voltage supplied to the memory device 100. More specifically, the voltage generator 122 may generate various operating voltages Vop for program, read and erase operations in response to an operation signal OPSIG. For example, the voltage generator 122 may generate a program voltage, a verify voltage, a pass voltage, a read voltage, and an erase voltage in response to the control of the control logic 130.

According to an embodiment, the voltage generator 122 may generate an internal power voltage by regulating an external power voltage. The internal power voltage generated by the voltage generator 122 may serve as an operating voltage of the memory device 100.

According to an embodiment, the voltage generator 122 may generate a plurality of voltages by using an external power voltage or an internal power voltage.

For example, the voltage generator 122 may include a plurality of pumping capacitors receiving the internal power voltage, and generate a plurality of voltages by selectively activating the plurality of pumping capacitors in response to the control of the control logic 130.

The plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 through the first to nth bit lines BL1 to BLn, respectively. The first to nth page buffers PB1 to PBn may operate in response to the control of the control logic 130. More specifically, the first to nth page buffers PB1 to PBn may operate in response to page buffer control signals PBSIGNALS. For example, the first to nth page buffers PB1 to PBn may temporarily store data received through the bit lines BL1 to BLn, or may sense voltages or currents in the bit lines BL1 to BLn during a read or verify operation.

More specifically, the first to nth page buffers PB1 to PBn may transfer data DATA received through the input/output circuit 125 to selected memory cells through the first to nth bit lines BL1 to BLn when a program pulse is applied to a selected word line during a program operation. The memory cells of the selected page may be programmed according to the transferred data DATA. A threshold voltage of a memory cell coupled to a bit line to which a program permission voltage (for example, a ground voltage) is applied may be increased. A threshold voltage of a memory cell coupled to a bit line to which a program inhibition voltage (for example, a power voltage) is applied may be maintained. During a program verify operation, the first to nth page buffers PB1 to PBn may read stored data from the selected memory cells through the first to nth bit lines BL1 to BLn.

During a read operation, the first to nth page buffers PB1 to PBn may read the data DATA from the memory cells of the selected page through the first to nth bit lines BL1 to BLn, respectively, and may output the read data DATA to the input/output circuit 125 in response to control of the column decoder 124.

During an erase operation, the first to nth page buffers PB1 to PBn may float the first to nth bit lines BL1 to BLn, respectively.

The column decoder 124 may transfer data between the input/output circuit 125 and the page buffer group 123 in response to a column address CADD. For example, the column decoder 124 may exchange data with the first to nth page buffers PB1 to PBn through data lines DL, or may exchange data with the input/output circuit 125 through column lines CL.

The input/output circuit 125 may transfer the command CMD and the address ADD from the memory controller 200 described above with reference to FIG. 1 to the control logic 130, or may exchange the data DATA with the column decoder 124.

A sensing circuit 126 may generate a reference current in response to an allowable bit signal VRYBIT and compare a sensing voltage VPB received from the page buffer group 123 with a reference voltage generated by the reference current to output a pass signal PASS or a fail signal FAIL during a read operation or a verify operation.

A temperature sensor 127 may sense the temperature of the memory device 100. The temperature sensor 127 may provide the control logic 130 with a temperature signal TEMP which has a voltage level varying depending on the temperature measured by the temperature sensor 127. The control logic 130 may generate temperature information showing the temperature of the memory device 100 in response to the temperature signal TEMP and may output the generated temperature information to an external device.

The control logic 130 may control the peripheral circuit 120 by outputting the operation signal OPSIG, the row address RADD, the page buffer control signals PBSIG-NALS and the allowable bit signal VRYBIT in response to the command CMD and the address ADD. In addition, the control logic 130 may determine whether a verify operation passes or fails in response to the pass or fail signal PASS or FAIL.

Figure 3:
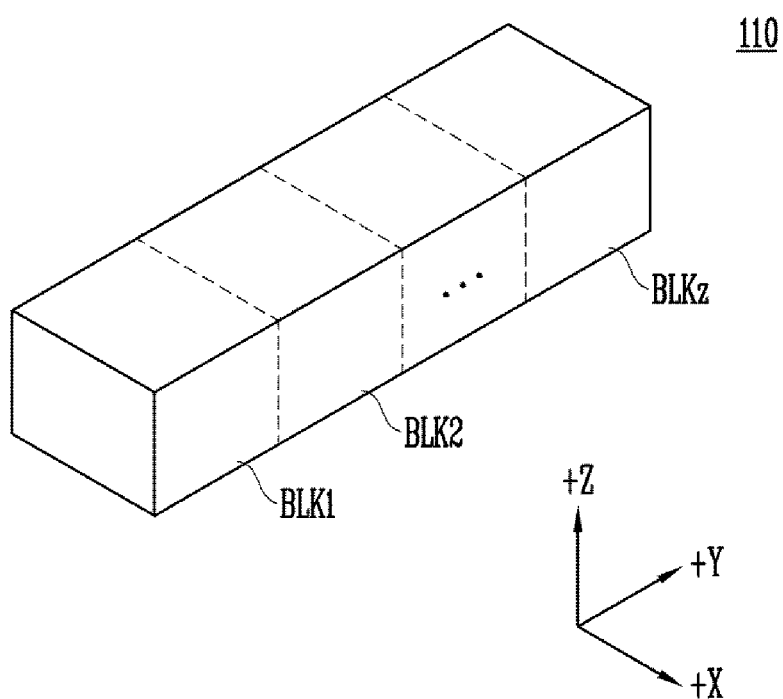
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include a plurality of memory blocks BLK1 to BLKz. Each of the memory blocks may have a three-dimensional structure. Each memory block may include a plurality of memory cells stacked over a substrate. The plurality of memory cells may be arranged in +X direction, +Y direction and +Z direction. Although FIG. 3 illustrates a three-dimensional structure, the present invention is not limited thereto. That is, the memory blocks may also have a two-dimensional structure. The structure of each memory block will be described in detail below with reference to FIGS. 4 and 5.

Figure 4:
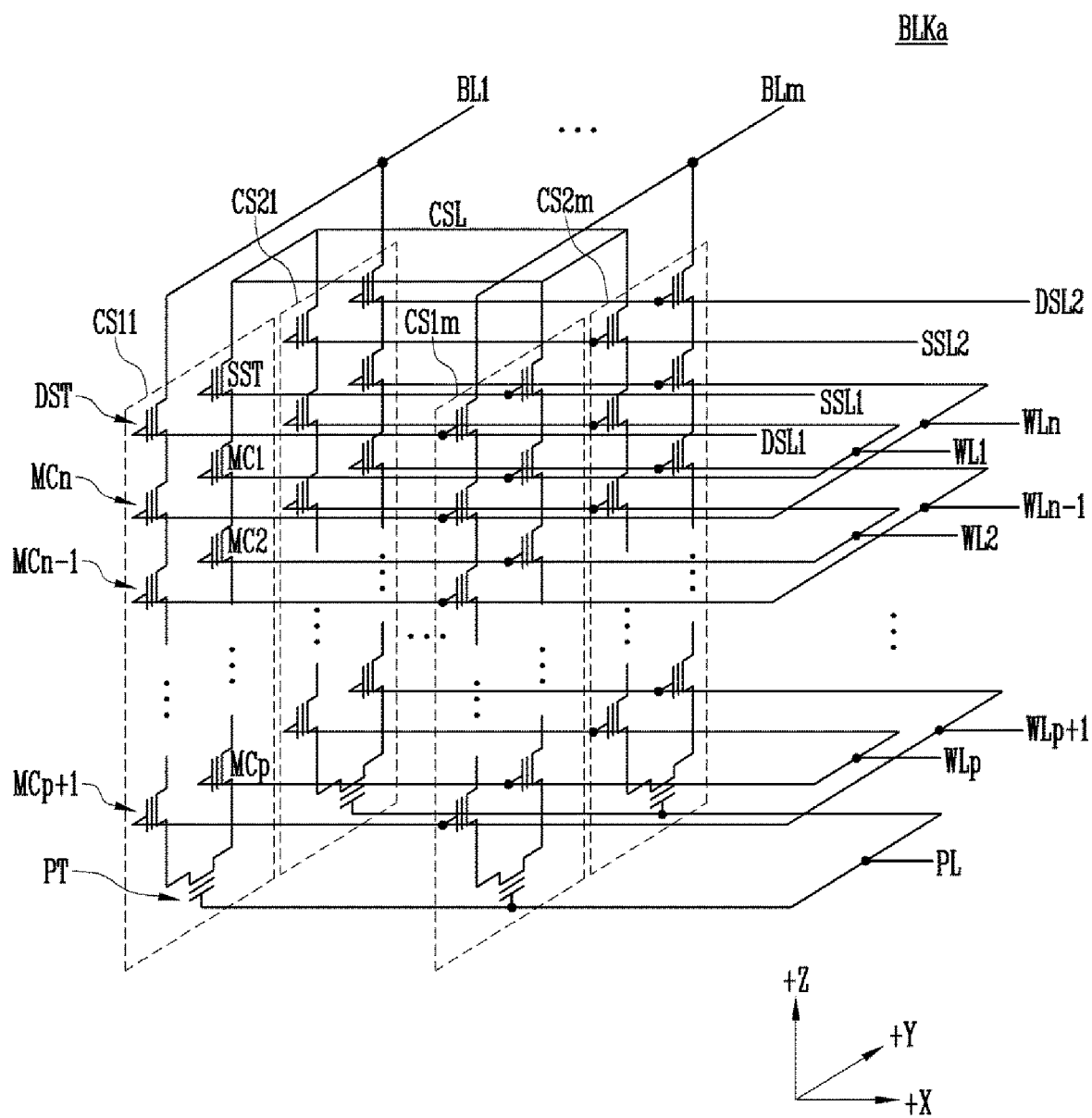
FIG. 4 is a circuit diagram illustrating a memory block BLKa among memory blocks BLK1 to BLKz shown in FIG. 3.

FIG. 4 is a circuit diagram illustrating a memory block BLKa among the memory blocks BLK1 to BLKz shown in FIG. 3.

Referring to FIG. 4, the memory block BLKa may include a plurality of cell strings CS11 to CS1*m* and CS21 to CS2*m*. According to an embodiment, each of the cell strings CS11 to CS1*m* and CS21 to CS2*m* may be formed in a U shape. In the memory block BLKa, 'm' cell strings may be arranged in a row direction (i.e., +X direction). In FIG. 4, it is illustrated that two cell strings are arranged in a column direction (i.e., +Y direction). However, it is understood that three or more cell strings may be arranged in the column direction.

Each of the cell strings CS11 to CS1*m* and CS21 to CS2*m* may include at least one source selection transistor SST, first to nth memory cells MC1 to MCn, a pipe transistor PT, and at least one drain selection transistor DST.

Each of the selection transistors SST and DST and each of the memory cells MC1 to MCn may have similar structures to each other. According to an embodiment, each of the select transistors SST and DST and the memory cells MC1 to MCn may include a channel layer, a tunneling insulating layer, a charge storage layer, and a blocking insulating layer. According to an embodiment, a pillar for providing the channel layer may be provided in each cell string. According to an embodiment, a pillar for providing at least one of the channel layer, the tunneling insulating layer, the charge storage layer, and the blocking insulating layer may be provided to each cell string.

The source selection transistor SST of each cell string may be coupled between a common source line CSL and memory cells MC1 to MCp.

According to an embodiment, source selection transistors of cell strings arranged in the same row may be coupled to a source selection line extending in a row direction, and source selection transistors of cell strings arranged in different rows may be coupled to different source selection lines. In FIG. 4, source selection transistors of the cell strings CS11 to CS1*m* in the first row may be coupled to a first source selection line SSL1. Source selection transistors of the cell strings CS21 to CS2*m* in the second row may be coupled to a second source selection line SSL2.

According to another embodiment, the source selection transistors of the cell strings CS11 to CS1*m* and CS21 to CS2*m* may be coupled in common to one source selection line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and may be coupled in series between the source selection transistor SST and the pipe transistor PT. The (p+1)th to nth memory cells MCp+1 to MCn may be sequentially arranged in the +Z direction and may be coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

A gate of the pipe transistor PT of each cell string may be coupled to a pipe line PL.

The drain selection transistor DST of each cell string may be coupled between the corresponding bit line and the memory cells MCp+1 to MCn. Cell strings arranged in the row direction may be coupled to a drain selection line extending in the row direction. Drain selection transistors of the cell strings CS11 to CS1*m* in the first row may be coupled to a first drain selection line DSL1. Drain selection transistors of the cell strings CS21 to CS2*m* in the second row may be coupled to a second drain selection line DSL2.

Cell strings arranged in the column direction may be coupled to a bit line extending in the column direction. As illustrated in FIG. 4, the cell strings CS11 and CS21 in the first column may be coupled to the first bit line BL1. The cell strings CS1*m* and CS2*m* in an mth column may be coupled to an mth bit line BLm.

Memory cells coupled to the same word line arranged in cell strings arranged in the row direction may form a single page. For example, memory cells coupled to the first word line WL1 in the cell strings CS11 to CS1*m* in the first row may constitute a single page. Memory cells coupled to the first word line WL1 in the cell strings CS21 to CS2*m* in the second row may constitute another page. When one of the drain selection lines DSL1 and DSL2 is selected, cell strings arranged in one row direction may be selected. When one of the first to nth word lines WL1 to WLn is selected, one page may be selected from selected cell strings.

In another embodiment, even bit lines and odd bit lines may be provided instead of first to mth bit lines BL1 to BLm. In addition, even cell strings of the cell strings CS11 to CS1*m* or CS21 to CS2*m* arranged in the row direction may be coupled to even bit lines, respectively, and odd cell strings of the cell strings CS11 to CS1*m* or CS21 to CS2*m* arranged in the row direction may be coupled to odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may increase, whereas the size of the memory block BLKa may increase. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 5:
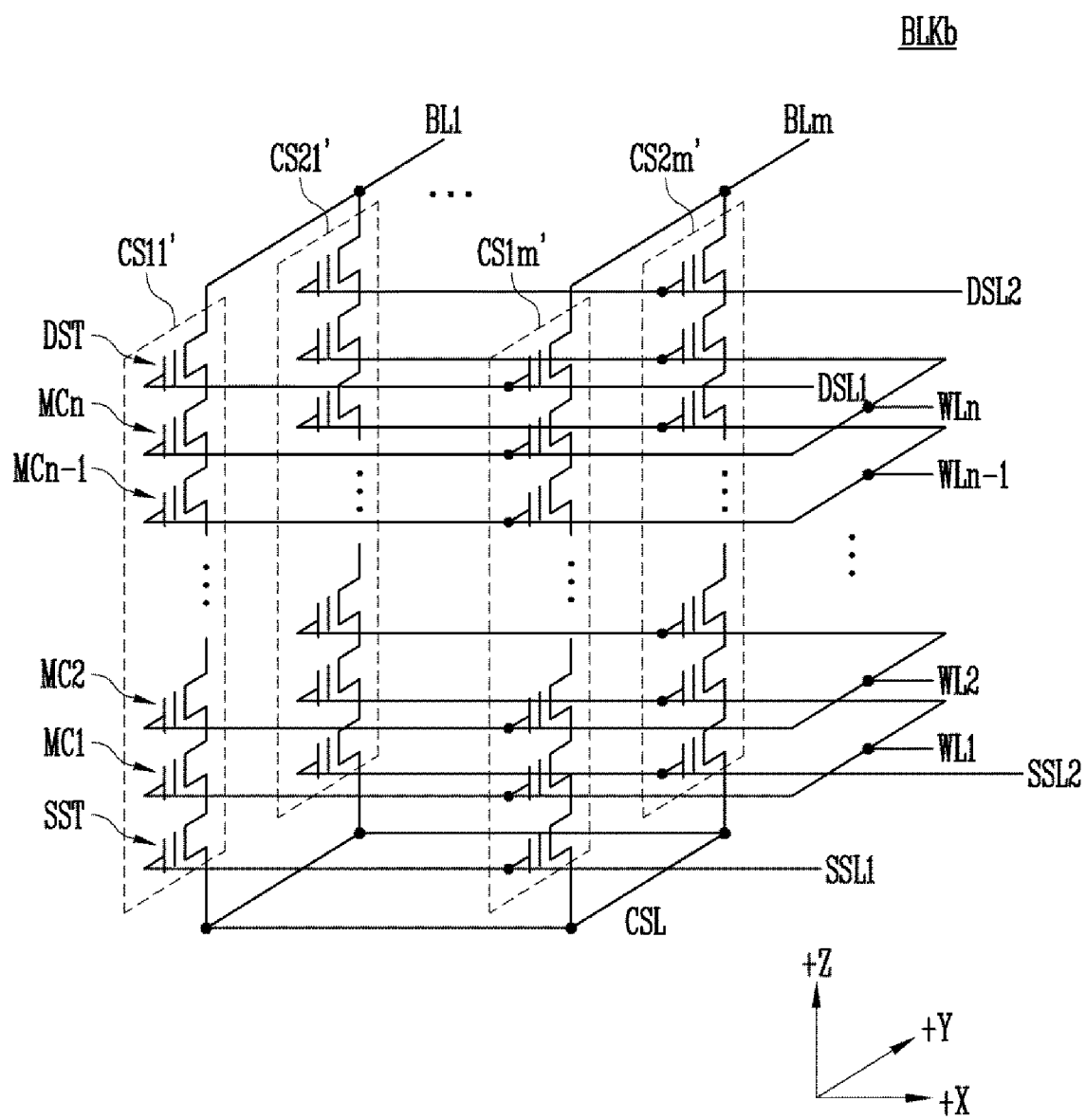
FIG. 5 is a circuit diagram illustrating a memory block BLKb among the memory blocks BLK1 to BLKz shown in FIG. 3.

FIG. 5 is a circuit diagram illustrating an embodiment of a memory block BLKb, among the memory blocks BLK1 to BLKz shown in FIG. 3.

Referring to FIG. 5, the memory block BLKb may include a plurality of cell strings CS11' to CS1*m*' and CS21' to CS2*m*'. Each of the plurality of cell strings CS11' to CS1*m*' and CS21' to CS2*m*' may extend in the +Z direction. Each of the plurality of cell strings CS11' to CS1*m*' and CS21' to CS2*m*' may include at least one source select transistor SST, the first to nth memory cells MC1 to MCn, and at least one drain select transistor DST which are stacked on a substrate (not shown) under a memory block BLK1'.

The source select transistor SST of each cell string may be coupled between the common source line CSL and the first to nth memory cells MC1 to MCn. Source selection transistors of cell strings arranged in the same row may be coupled to the same source selection line. Source selection transistors of the cell strings CS11' to CS1*m*' arranged in the first row may be coupled to a first source selection line SSL1. Source select transistors of the cell strings CS21' to CS2*m*' arranged in the second row may be coupled to a second source select line SSL2. According to another embodiment, the source selection transistors of the cell strings CS11' to CS1*m*' and CS21' to CS2*m*' may be coupled to a single source selection line.

The first to nth memory cells MC1 to MCn of each cell string may be coupled between the source select transistor SST and the drain select transistor DST. Gates of the first to nth memory cells MC1 to MCn may be coupled to the first to nth word lines WL1 to WLn, respectively.

The drain selection transistor DST of each cell string may be coupled between the corresponding bit line and the memory cells MC1 to MCn. Drain selection transistors of cell strings arranged in the row direction may be coupled to a drain selection line extending in the row direction. Drain selection transistors of the cell strings CS11' to CS1*m*' in the first row may be coupled to the first drain selection line DSL1. The drain select transistors of the cell strings CS21' to CS2*m*' in the second row may be coupled to the second drain select line DSL2.

As a result, the memory block BLKb shown in FIG. 5 may have a circuit similar to that of the memory block BLKa shown in FIG. 4, except that the pipe transistor PT that is included in each cell string of the memory block BLKa of FIG. 4 may be excluded in each cell string of the memory block BLKb of FIG. 5.

In another embodiment, even bit lines and odd bit lines may be provided instead of the first to mth bit lines BL1 to BLm. Even cell strings of the cell strings CS11' to CS1*m*' or CS21' to CS2*m*' arranged in the row direction may be coupled to the even bit lines, respectively, and odd cell strings of the cell strings CS11' to CS1*m*' or CS21' to CS2*m*' arranged in the row direction may be coupled to the odd bit lines, respectively.

According to an embodiment, at least one of the first to nth memory cells MC1 to MCn may serve as a dummy memory cell. For example, one or more dummy memory cells may be provided to reduce an electric field between the source select transistor SST and the first to nth memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may increase, whereas the size of the memory block BLKb may increase. When fewer memory cells are provided, the size of the memory block BLKb may be reduced and the operational reliability of the memory block BLKb may be degraded.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after a program operation is performed, the dummy memory cells may have required threshold voltages by controlling a voltage applied to dummy word lines coupled to the dummy memory cells.

Figure 6:
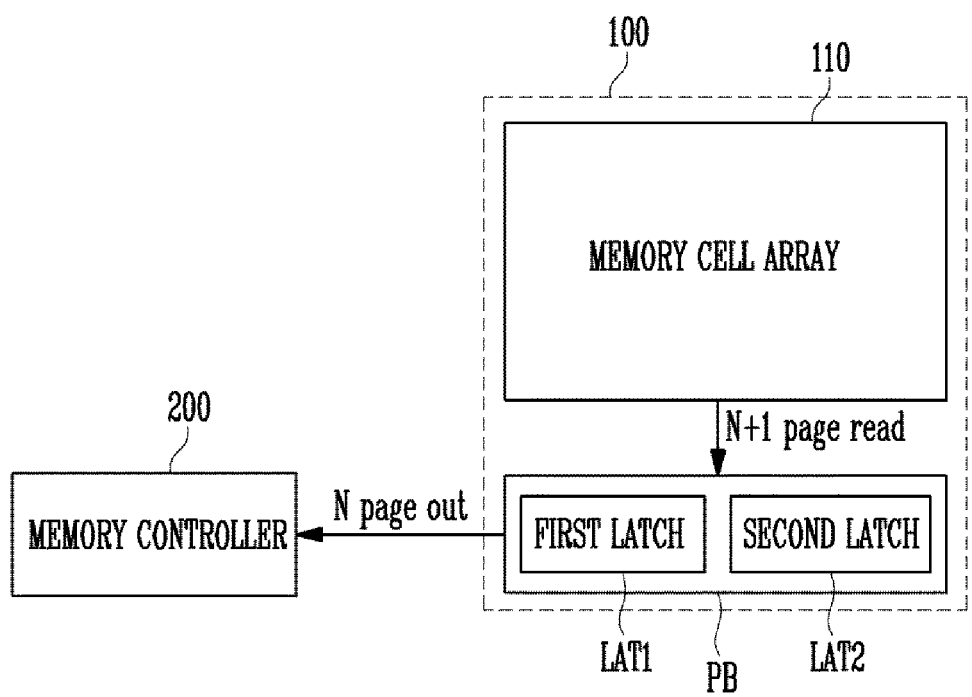
FIG. 6 is a diagram illustrating a cache read operation.

FIG. 6 is a diagram illustrating a cache read operation.

Referring to FIG. 6, the memory device 100 may include the memory cell array 110 and a page buffer PB. The page buffer PB of FIG. 6 may refer to one of the configurations of the first to nth page buffers PB1 to PBn included in the page buffer group 123 described above with reference to FIG. 2.

During the cache read operation, while data of a single page included in the memory device 100 is read and the data of the single page stored in the page buffer to the memory controller 200 is output, data of another page of the memory cell array 110 may be read by the page buffer to improve performance of the storage device 50 which is described above with reference to FIG. 1.

FIG. 6 shows a method of performing cache read on two consecutive pages (e.g., Nth page and (N+1)th page) indicated by addresses for which the cache read is requested.

The page buffer PB may include a first latch LAT1 and a second latch LAT2. The first latch LAT1 may be a main latch and the second latch LAT2 may be a cache latch. Data read from the memory cell array 110 may be stored in the first latch LAT1 which is the main latch. Data stored in the main latch may be transferred to the second latch LAT2.

First, a read operation may be performed on an Nth page. When the read operation is performed, Nth page data may be stored in the first latch LAT1. According to an embodiment, the data stored in the first latch LAT1 may be transferred to the second latch LAT2.

When the Nth data is stored in the second latch LAT2, the stored data may be output in response to the request of the memory controller 200. The Nth page data stored in the second latch LAT2 may be provided to the memory controller 200 (denoted as "N page out").

When the Nth page data stored in the second latch LAT2 is provided to the memory controller 200, (N+1)th page data of the memory cell array 110 may be read and stored in the first latch LAT1 (N+1 page read).

Figure 7:
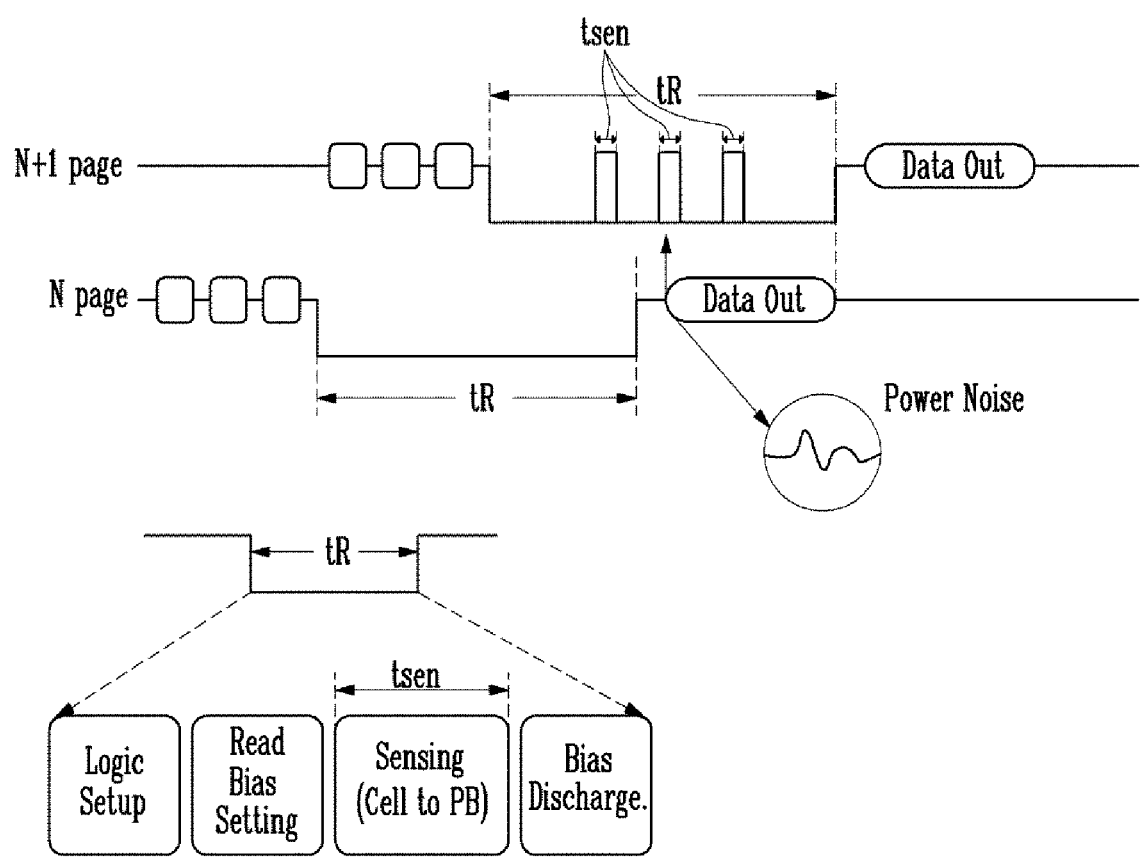
FIG. 7 is a diagram illustrating problems that occur during a cache read operation.

FIG. 7 is a diagram illustrating problems that may occur during a cache read operation.

Referring to FIG. 7, a cache read operation of data of an Nth page (denoted as "N page") and an (N+1)th page (denoted as "N+1 page") is illustrated. When a time required to perform a read operation on a single page is tR, the time tR may be required for each of the Nth page and the (N+1)th page. When the time tR passes, the Nth page data and the (N+1)th page data may be stored in the page buffer PB as described above with reference to FIG. 6. Subsequently, the page data stored in the page buffer PB may be output in response to a data output command input from the memory controller 200.

The read operation may be divided into a plurality of periods. For example, a read operation may be divided into a logic setup period, a read bias setting period, a sensing period, and a bias discharge period.

During the logic setup period, a read command may be received and related logic may be set up. For example, an algorithm for performing a read operation may be loaded during the logic setup period.

During the read bias setting period, a voltage relating to the read operation may be generated using a voltage pump and the generated voltage may be applied. For example, a read voltage Vread may be applied to a selected word line and a pass voltage Vpass may be applied to unselected word lines.

During the sensing period, data stored in a memory cell may be sensed after voltages set up during the read bias setting period are applied. For example, the data stored in the memory cell may be stored in a page buffer by sensing a voltage or a current in a bit line coupled to the memory cell.

During the bias discharge period, a voltage of each line coupled to the memory cell array may be discharged.

During the sensing period, the data of the memory cell may be stored in the page buffer. Therefore, the accuracy of the operation during the sensing period may be closely related to the accuracy of the read operation. An operation (denoted as "Data Out") of outputting the page data stored in the page buffer PB in response to the data output command may consume much driving power. Therefore, when the sensing period overlaps the data output operation, power noise may occur, and as a result, an accurate sensing operation may not be ensured. The power noise may lead to temporary increases in threshold voltages of memory cells. When a read operation is performed using default read voltages which are predetermined basic read voltages, the number of errors occurring may increase.

Figure 8:
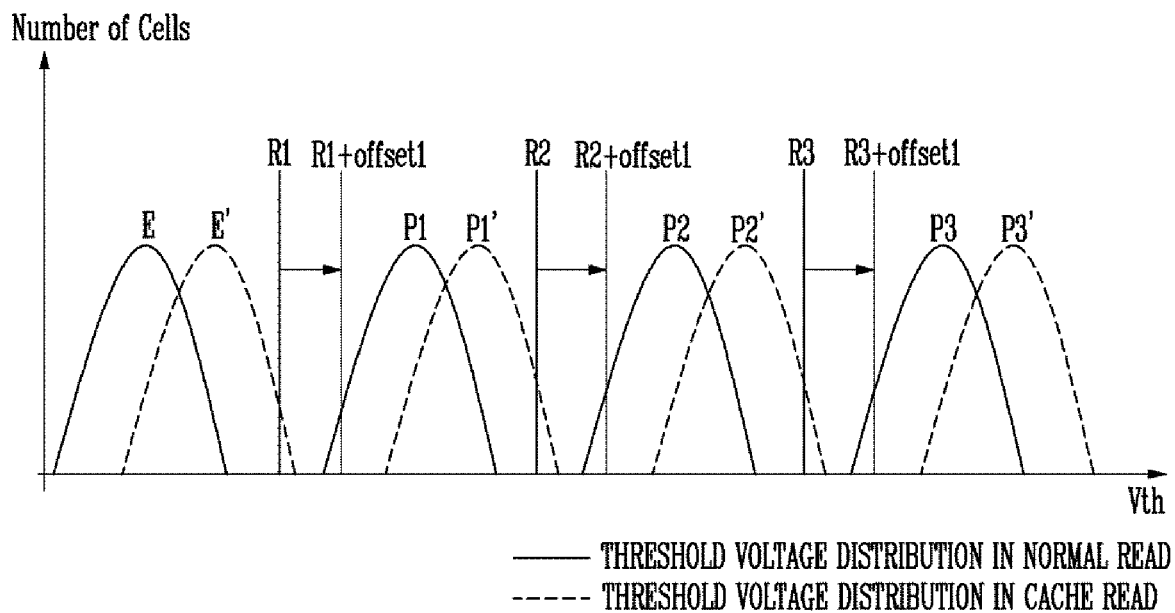
FIG. 8 is a diagram illustrating a threshold voltage distribution during a normal read operation and a cache read operation.

FIG. 8 is a diagram illustrating a threshold voltage distribution during a normal read operation and a cache read operation.

Referring to FIG. 8, a horizontal axis refers to a threshold voltage of a memory cell and a vertical axis refers to the number of memory cells included in the corresponding threshold voltage. Although FIG. 8 shows, as an example, memory cells each of which is a multi-level cell (MCL) storing two-bit data, the present invention is not limited thereto. That is, an embodiment of the invention may also be applicable to memory cells in which data of more than two bits are stored.

The memory cells may be programmed to correspond to one of an erase state E, a first program state P1, a second program state P2, and a third program state P3.

First to third read voltages R1 to R3 may be default read voltages. The first read voltage R1 may differentiate the erase state E from the first program state P1, the second read voltage R2 may differentiate the first program state P1 from the second program state P2, and the third read voltage R3 may differentiate the second program state P2 from the third program state P3.

During a cache read operation, source line bouncing and interference of bit line capacitances in addition to the power noise as described above with reference to FIG. 7 may cause threshold voltage distributions to change from the erase state E, the first program state P1, the second program state P2, and the third program state P3 to an erase state E', a first program state P1', a second program state P2', and a third program state P3', respectively, as compared with a normal read operation.

Therefore, when a read operation is performed using the default read voltages, which are the first to third read voltages R1 to R3 during the cache read operation, the number of errors may be increased and the read operation may fail.

According to an embodiment, as for the cache read operation, the read operation may be performed using cache read voltages R1+offset1, R2+offset1, and R3+offset1 obtained by adding a first offset voltage offset1 to the first, second, and third read voltages R1, R2, and R3, respectively. Therefore, since the read voltages are changed according to the changes in the threshold voltage distributions caused by the cache read operation, failure of the read operation may be reduced.

According to an embodiment, in comparison with the normal read operation, the first offset voltage offset1 may correspond to the amount of the increases in the threshold voltages of the memory cells during the cache read operation. The first offset voltage may have a positive voltage value greater than 0 V. For example, the first offset voltage offset1 may correspond to 60 mV or 100 mV. The size of the first offset voltage offset1 may be determined in advance by testing the memory device.

Figure 9:
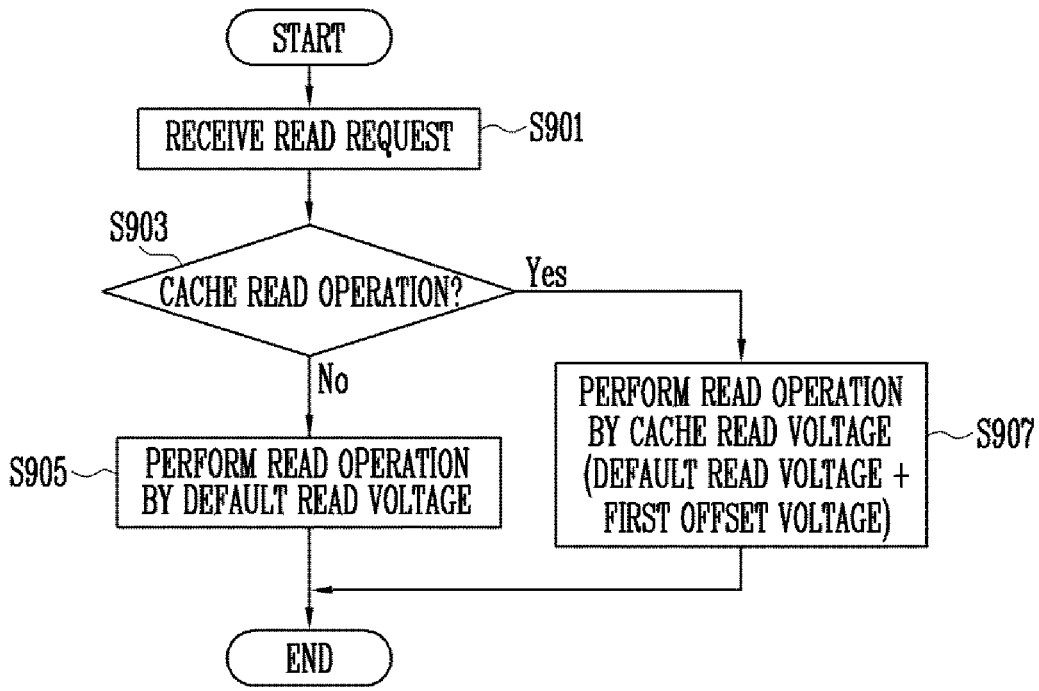
FIG. 9 is a flowchart describing operations of a memory controller according to an embodiment.

FIG. 9 is a flowchart describing operations of a memory controller, for example the memory controller 200 of FIG. 1, according to an embodiment.

Referring to FIG. 9, at step S901, the memory controller 200 may receive a read request from a host 400. The memory controller 200 may convert a logical address corresponding to the read request into a physical address.

At step S903, the memory controller 200 may determine whether or not a read operation to be performed is a cache read operation. For example, when physical addresses corresponding to the read request are sequential addresses, a cache read operation may be performed. According to various embodiments, regardless of the physical addresses corresponding to the read request, when the memory device 100 is set to perform a cache read operation, the cache read operation may be performed. When the read operation to be performed is the cache read operation (that is, "Yes" at step S903), the process proceeds to step S907. When the read operation to be performed is determined not to be the cache read operation, the process proceeds to step S905.

At step S905, when the memory controller 200 determines that the read operation to be performed is not the cache read operation, the memory controller 200 may control the memory device 100 to perform a read operation using a default read voltage.

At step S907, when the memory controller 200 determines that the read operation to be performed is the cache read operation, the memory controller 200 may control the memory device 100 to perform a read operation using a cache read voltage obtained by adding a first offset voltage to the default read voltage. For example, the memory controller 200 may provide a cache read command different from a normal read command, and the memory device 100 receiving the cache read command may perform the read operation using the cache read voltages. Alternatively, according to an embodiment, the memory controller 200 may provide a read voltage set command for changing the read voltage from the default read voltage to the cache read voltage before providing the cache read command to the memory device 100, and may then provide the cache read command. According to an embodiment, the read voltage set command may be a parameter set command for instructing to change a value of a predetermined register included in the memory device 100.

Figure 10:
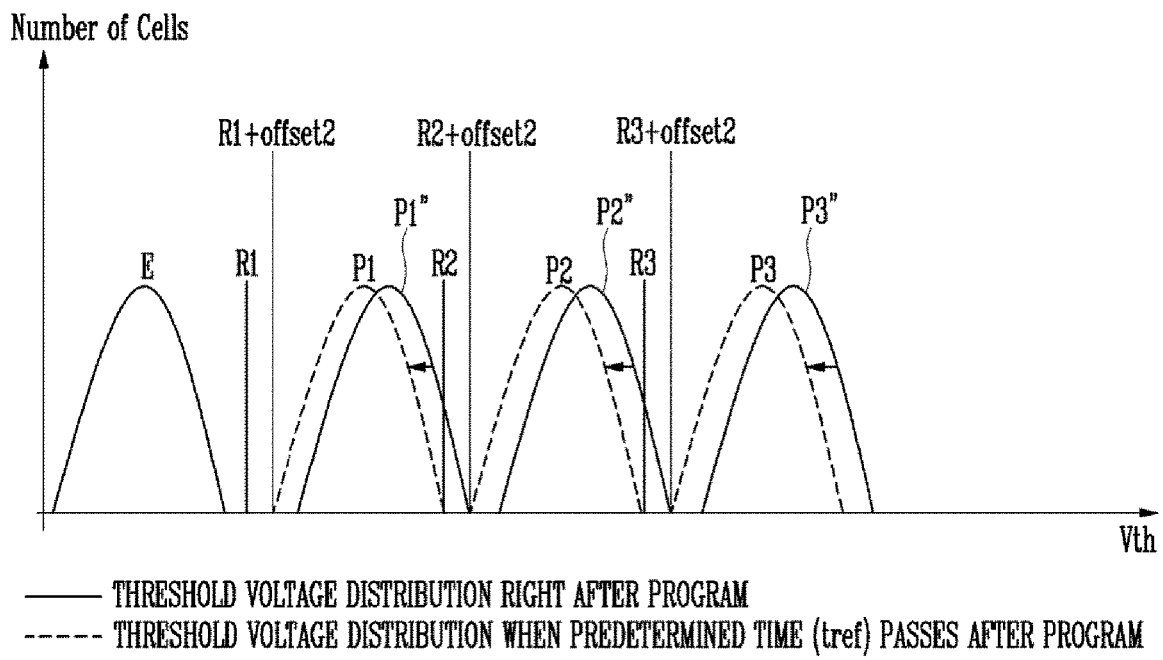
FIG. 10 is a diagram illustrating a change in threshold voltage distribution during a short-time read operation.

FIG. 10 is a diagram illustrating a change in threshold voltage distribution during a short-time read operation.

Referring to FIG. 10, a horizontal axis refers to a threshold voltage of a memory cell and a vertical axis refers to the number of memory cells included in the corresponding threshold voltage. Although FIG. 10 shows, as an example, memory cells each of which is a multi-level cell (MCL) storing two-bit data, the present invention is not limited thereto. That is, embodiments of the invention may also be applicable to memory cells in which data of more than two bits are stored.

The memory cells may be programmed to correspond to one of the erase state E, the first program state P1, the second program state P2, and the third program state P3.

The memory cells right after the program operation is performed may have a threshold voltage distribution corresponding to one of the erase state E, a first program state P1", a second program state P2", and a third program state P3".

When a predetermined time tref passes after the program operation is performed, threshold voltages of memory cells corresponding to the program states P1", P2", and P3" may be changed into the first, second, and third program states P1, P2, and P3, respectively. In other words, as compared to right after the program operation is performed, when a reference time tref passes, threshold voltages of the memory cells having the program states P1", P2" and P3" may be reduced, which may be referred to as an 'Early Retention Fail (ERF)'. Therefore, when the corresponding memory cells are read right after the program, i.e., when a read operation is performed using the first to third read voltages R1 to R3 which are default read voltages, the probability of occurrence of errors may increase.

Therefore, according to an embodiment, a read operation performed right after a program operation is performed may be performed using a read voltage R1+offset2, R2+offset2, and R3+offset2 higher than a default read voltage R1 to R3.

More specifically, a second offset voltage offset2 may be determined by the read voltage setting component 210 according to an elapsed time corresponding to a time which has passed since the program operation was performed, and a read operation may be performed using short-time read voltages R1+offset2, R2+offset2, and R3+offset2 obtained by adding the second offset voltage offset2 to default read voltages R1 to R3.

According to an embodiment, the second offset voltage offset2 may have a voltage level corresponding to threshold voltages of memory cells that change over time after the program operation. The second offset voltage offset2 may have a positive voltage value greater than 0 V. For example, the second offset voltage offset2 may be 100 mV when the elapsed time is zero seconds, the second offset voltage offset2 may be 60 mV when the elapsed time is ten seconds, and the second offset voltage offset2 may be 20 mV when the elapsed time is thirty seconds. The voltage level of the second offset voltage offset2 which is applied depending on the elapsed time may be determined in advance by testing the memory device.

Figure 11:
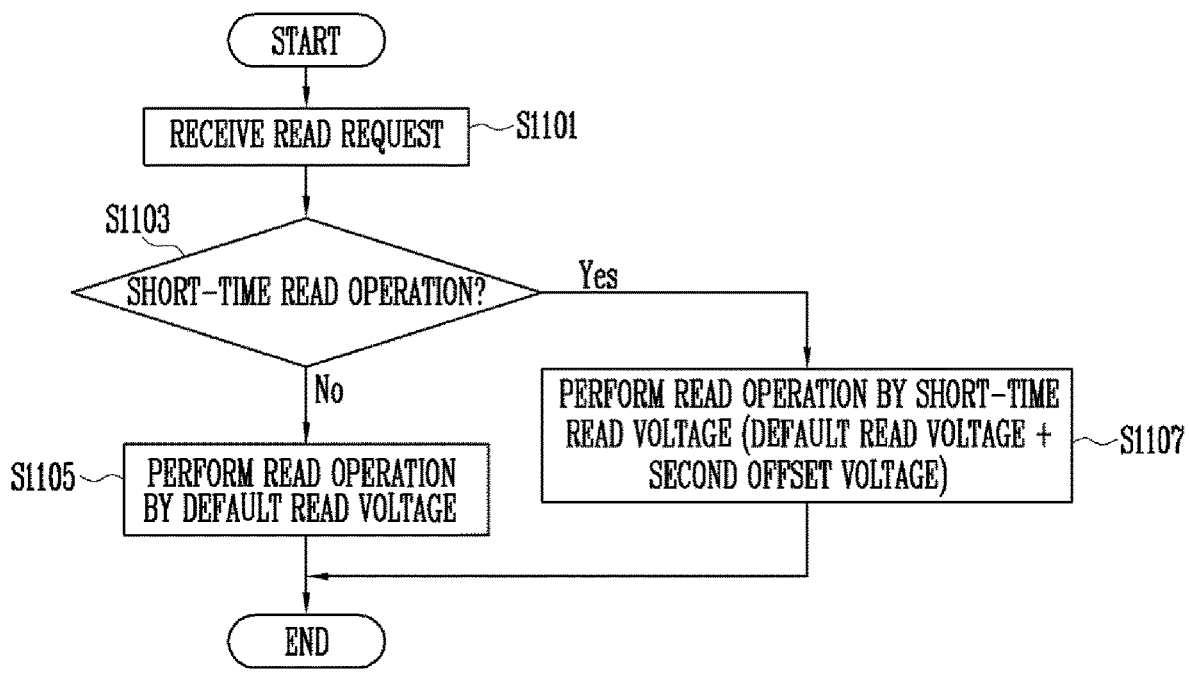
FIG. 11 is a flowchart describing operations of a memory controller according to an embodiment.

FIG. 11 is a flowchart describing operations of a memory controller, for example the memory controller 200 of FIG. 1, according to an embodiment.

Referring to FIG. 11, at step S1101, the memory controller 200 may receive a read request from a host 400. The memory controller 200 may convert a logical address corresponding to the read request into a physical address.

At step S1103, the memory controller 200 may determine whether or not a read operation to be performed in response to the read request is a short-time read operation. For example, a read operation performed after a reference time has passed since data for which the read request is made was programmed may be a normal read operation, and a read operation performed before the reference time passes may be a short-time read operation. When a read operation to be performed is the short-time read operation (that is, "Yes" at step S1103), the process proceeds to step S1107. When a read operation to be performed is determined not to be the short-time read operation (that is, "No" at step S1103), the process proceeds to step S1105.

At step S1105, when the memory controller 200 determines that a read operation to be performed is not the short-time read operation, the memory controller 200 may control the memory device 100 to perform a read operation using a default read voltage.

At step S1107, when the memory controller 200 determines that a read operation to be performed is the short-time read operation, the memory controller 200 may control the memory device 100 to perform a read operation using a short-time read voltage. For example, the memory controller 200 may control the memory device 100 to determine a voltage level of a second offset voltage, and to perform the read operation using a short-time read voltage obtained by adding the second offset voltage to the default read voltage. For example, the memory controller 200 may provide a short-time read command different from the normal read command, and the memory device 100 receiving the short-time read command may perform the read operation using the short-time read voltage.

According to an embodiment, the memory controller 200 may provide a read voltage set command for changing the read voltage from the default read voltage to the short-time read voltage, and may then provide the normal read command. According to an embodiment, the read voltage set command may be a parameter set command for instructing to change a value of a predetermined register included in the memory device 100.

Figure 12:
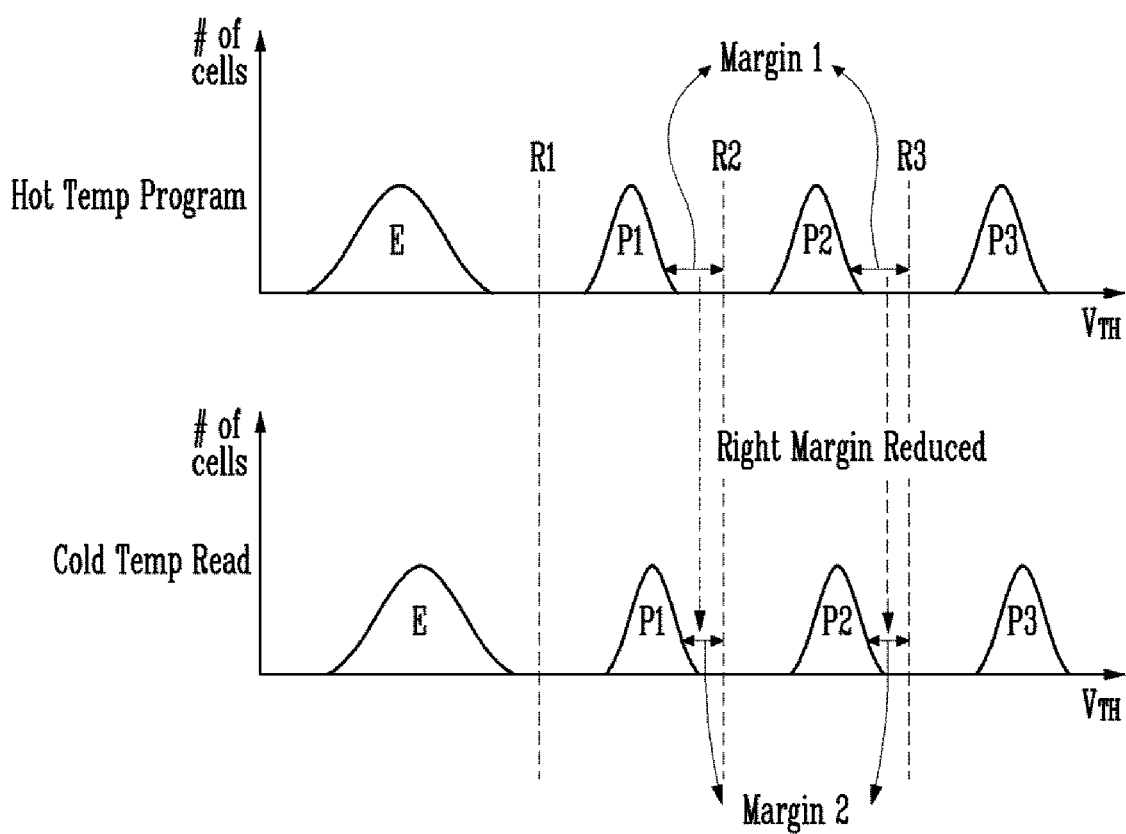
FIG. 12 is a diagram illustrating a change in threshold voltage distribution caused by a temperature difference between a program operation and a read operation.

FIG. 12 is a diagram illustrating a change in threshold voltage distribution caused by a difference between a temperature during a program operation and a temperature during a read operation.

Referring to FIG. 12, a horizontal axis refers to a threshold voltage of a memory cell and a vertical axis refers to the number of memory cells included in the corresponding threshold voltage. Although FIG. 12 shows, as an example, a graph showing memory cells each of which is a multi-level cell (MCL) storing two-bit data, the present invention is not limited thereto. That is, embodiments of the invention may also be applicable to memory cells in which data of more than two bits are stored.

The memory cells may be programmed to correspond to one of the erase state E, the first program state P1, the second program state P2, and the third program state P3.

In general, when a read operation is performed, an increase rate of a cell current flowing through a memory cell may be reduced in relatively low-temperature environment. Therefore, even when a memory cell is programmed with a sufficient read margin during a program operation, if a read operation is performed at a lower temperature than the temperature during the program operation, a threshold voltage of the memory cell may be increased and the increased threshold voltage of the memory cell may be read. On the other hand, when a read operation is performed at a higher temperature than the temperature of the program operation, the threshold voltage of the memory cell may be reduced and the reduced threshold voltage of the memory cell may be read.

In FIG. 12, a read margin of a threshold voltage distribution of memory cells during a program operation performed at a relatively high temperature (denoted as "Hot Temp Program") may be defined as a margin 1. Thus, a read margin of a threshold voltage distribution of memory cells during a read operation performed at a lower temperature (denoted as "Cold Temp Read") than the temperature of the program operation will be a margin 2 having a smaller width than the margin 1.

Therefore, when a read operation is performed using the first to third read voltages R1 to R3 which are default voltages at a lower temperature than that of the program operation, the probability of occurrence of errors may be increased due to a change in the threshold voltage.

According to an embodiment, a storage device may perform a read operation using a cross temperature read voltage obtained by adding a third offset voltage offset3 corresponding to a variation of a threshold voltage which corresponds to the temperature difference between the program operation and the read operation.

According to an embodiment, the third offset voltage offset3 may have a value which is increased as the temperature difference between the program operation and the read operation increases. More specifically, when the temperature of the program operation is higher than that of the read operation, the third offset voltage offset3 may have a value greater than zero. On the other hand, when the temperature of the program operation is lower than that of the read operation, the third offset voltage offset3 may have a value less than zero.

According to an embodiment, the third offset voltage offset3 may be increased by a predetermined unit voltage each time the temperature difference between the program operation and the read operation reaches a unit temperature. For example, the third offset voltage offset3 may be increased by mV each time the temperature difference between the program operation and the read operation reaches 10° C. The voltage level of the unit voltage determined by the temperature difference between the program operation and the read operation may be determined in advance by testing the memory device.

Figure 13:
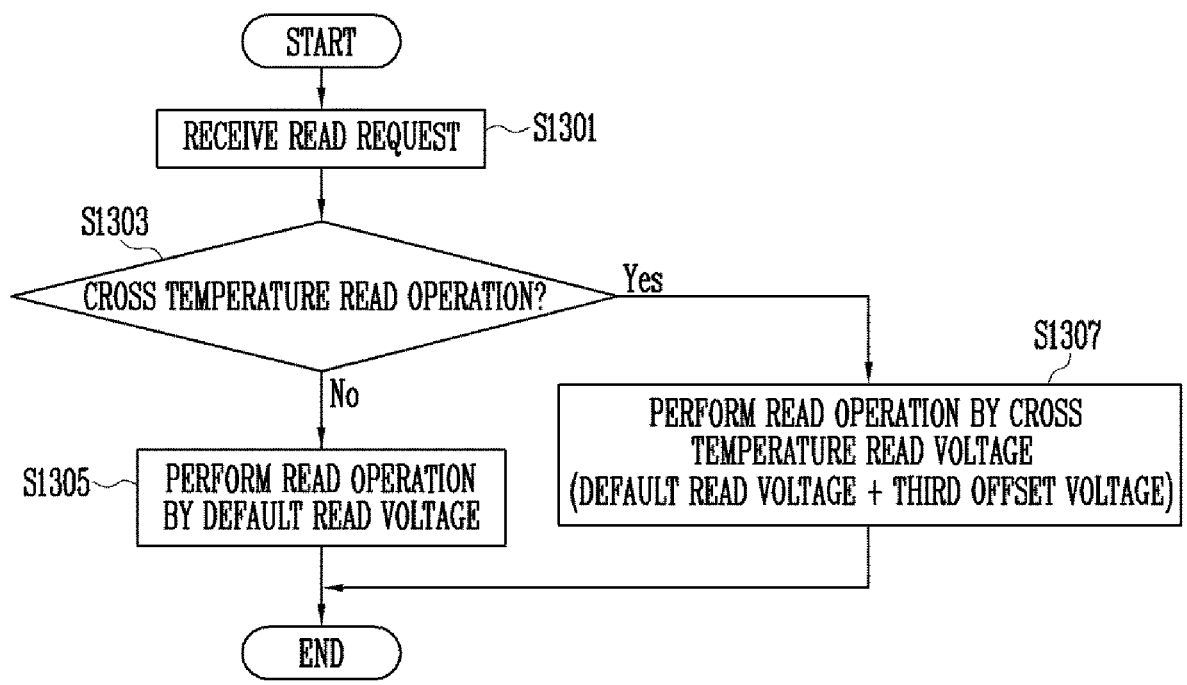
FIG. 13 is a flowchart describing operations of a memory controller according to an embodiment.

FIG. 13 is a flowchart describing operations of a memory controller, for example the memory controller 200 of FIG. 1, according to an embodiment.

Referring to FIG. 13, at step S1301, the memory controller 200 may receive a read request from a host 400. The memory controller 200 may convert a logical address corresponding to the read request into a physical address.

At step S1303, the memory controller 200 may determine whether or not a read operation to be performed in response to the read request is a cross temperature read operation. For example, when a temperature difference between a program operation and the read operation is smaller than a reference temperature, the read operation may be a normal read operation, and otherwise, the read operation may be a cross temperature read operation. When the read operation to be performed is the cross temperature read operation (that is, "Yes" at step S1303), the process proceeds to step S1307. When the read operation to be performed is not the cross temperature read operation (that is, "No" at step S1303), the process proceeds to step S1305.

At step S1305, when the memory controller 200 determines that the read operation to be performed is not the cross temperature operation, the memory controller 200 may control the memory device 100 to perform a read operation using a default read voltage.

At step S1307, when the memory controller 200 determines that the read operation to be performed is the cross temperature operation, the memory controller 200 may control the memory device 100 to perform the read operation using cross temperature read voltages. For example, the memory controller 200 may control the memory device 100 to determine the voltage level of the third offset voltage offset3 which is increased by a predetermined unit voltage each time the temperature difference between the program operation and the read operation reaches a unit temperature, and to perform a read operation using the cross temperature read voltage obtained by adding the third offset voltage offset3 to the default read voltage. For example, the memory controller 200 may provide a cross temperature read command different from a normal read command, and the memory device 100 receiving the cross temperature read command may perform the read operation using the cross temperature read voltages.

According to an embodiment, the memory controller 200 may provide a read voltage set command for changing the read voltage from the default read voltage to the cross temperature read voltage, and may then provide the normal read command. According to an embodiment, the read voltage set command may be a parameter set command for instructing to change a value of a predetermined register included in the memory device 100.

Figure 14A:
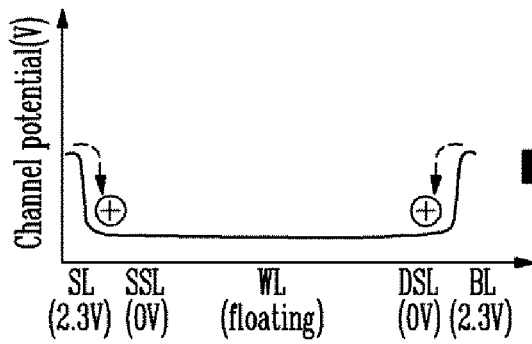
FIGS. 14A and 14B are diagrams illustrating phenomena that occurs in an unselected memory block among a plurality of memory blocks.
Figure 14B:
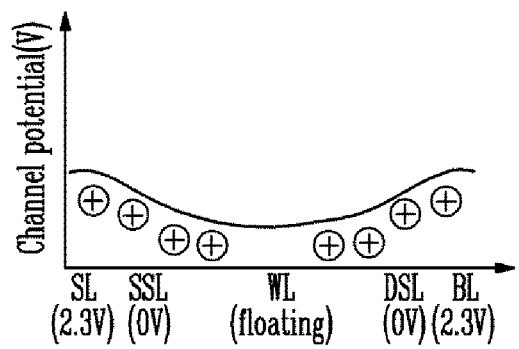

FIGS. 14A and 14B are diagrams illustrating phenomena that occurs in an unselected memory block among a plurality of memory blocks.

Referring to FIG. 14, a program operation, a read operation, and an erase operation may be performed on a memory block selected by an address, among a plurality of memory blocks, for example the plurality of memory blocks BLK1 to BLKz of FIG. 2. Therefore, word lines coupled to unselected memory blocks may be controlled to be in a floating state so that threshold voltages of memory cells included in the unselected memory blocks may not be changed, and a ground voltage of 0 V may be applied to a source selection line and a drain selection line coupled to the unselected memory blocks so as to turn off a source selection transistor and a drain selection transistor, respectively.

For example, when a predetermined memory block is unselected, charges may be partly injected through a junction part of a channel corresponding to a source selection line and a drain selection line as shown in FIG. 14A. Therefore, the potential of a channel region of the memory cells may be increased as shown in FIG. 14B. Thereafter, when the channel of the memory cells included in the unselected memory blocks is boosted, the threshold voltages of the memory cells may be increased in a positive direction.

Therefore, when a read operation is first performed on the unselected memory block, the read operation may be performed with the threshold voltages of the memory cells increased. When the read operation is performed using a default read voltage, errors may be increased. As a result, the read operation may fail. This may be referred to as a first page read fail.

According to an embodiment, when a first page read operation is performed so that a read operation is first performed on an unselected memory block, the storage device may perform the read operation using a first page read voltage obtained by adding a predetermined fourth offset voltage offset4 to a default read voltage.

According to an embodiment, the fourth offset voltage offset4 may have a positive voltage value greater than 0 V. The voltage level of the fourth offset voltage offset4 may be determined in advance by testing the memory device.

Figure 15:
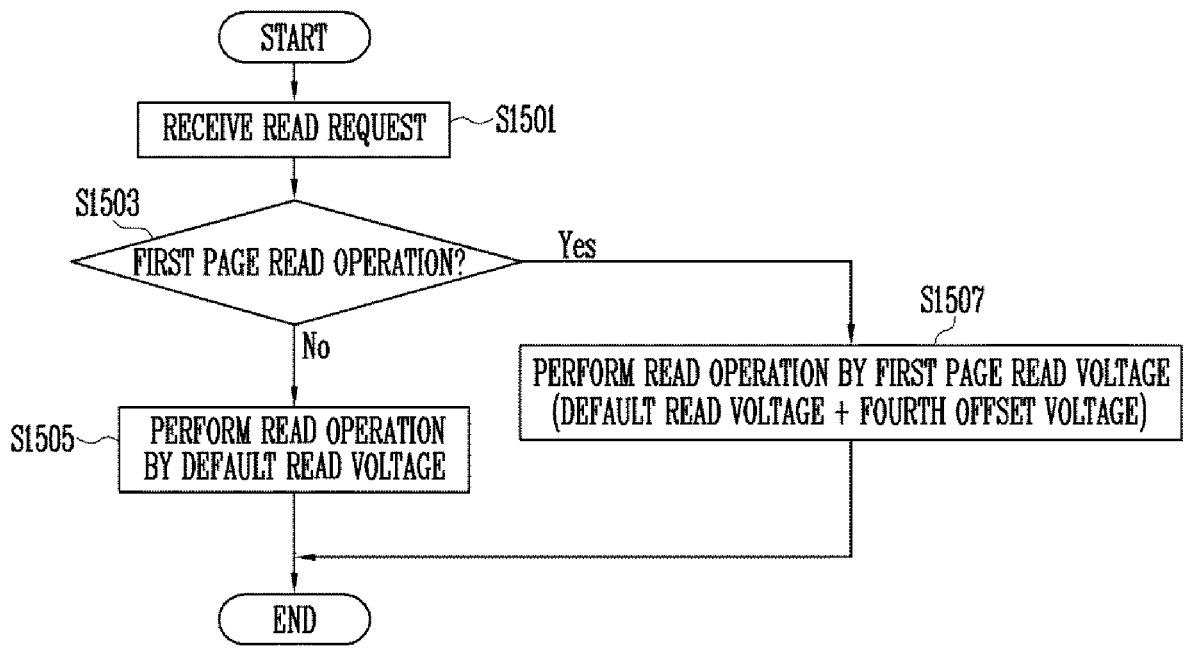
FIG. 15 is a flowchart describing operations of a memory controller according to an embodiment.

FIG. 15 is a flowchart describing operations of a memory controller, for example the memory controller 200 of FIG. 1, according to an embodiment.

Referring to FIG. 15, at step S1501, the memory controller 200 may receive a read request from a host 400. The memory controller 200 may convert a logical address corresponding to the read request into a physical address.

At step S1503, the memory controller 200 may determine whether or not a read operation to be performed in response to the read request is a first page read operation. For example, the memory controller may determine whether the read operation to be performed is the first page read operation according to whether a memory block including a page on which the read operation is to be performed corresponds to an unselected block in a previous operation. More specifically, when the memory block including the page on which the read operation is to be performed is the unselected block in the previous operation, the read operation may be the first page read operation, and otherwise, the read operation may be a normal read operation. When the read operation to be performed is the first page read operation (that is, "Yes" at step S1503), the process proceeds to step S1507. When the read operation to be performed is not the first page read operation (that is, "No" at step S1503), the process proceeds to step S1505.

At step S1505, when the memory controller 200 determines that the read operation to be performed is not the first page read operation, the memory controller 200 may control the memory device 100 to perform the read operation using a default read voltage.

At step S1507, when the memory controller 200 determines that the read operation to be performed is the first page read operation, the memory controller 200 may control the memory device to perform the read operation using first page read voltages. For example, the memory controller 200 may control the memory device 100 to perform the read operation using the first page read voltage obtained by adding the fourth offset voltage offset4 to the default read voltage. For example, the memory controller 200 may provide a first page read command different from a normal read command, and the memory device 100 receiving the first page read command may perform the read operation using the first page read voltages.

According to an embodiment, the memory controller 200 may provide a read voltage set command for changing the read voltage from the default read voltage to the first page read voltage, and may then provide the normal read command. According to an embodiment, the read voltage set command may be a parameter set command for instructing to change a value of a predetermined register included in the memory device 100.

Figure 16:
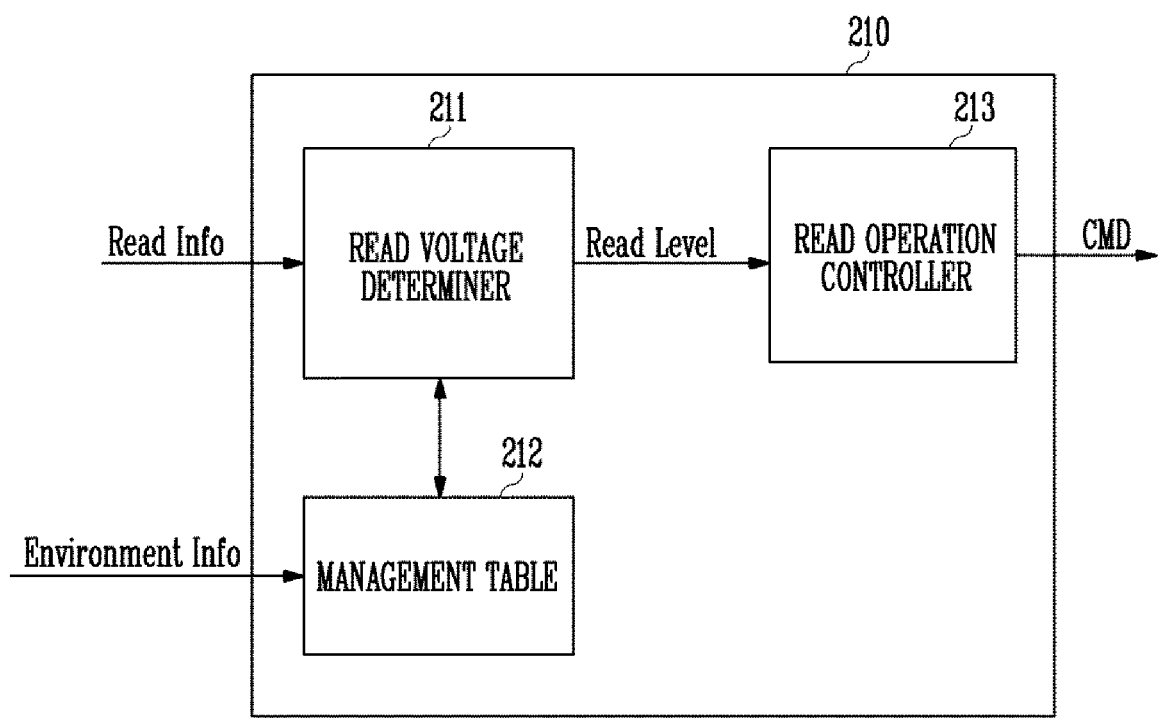
FIG. 16 is a block diagram illustrating the structure of a read voltage setting component of FIG. 1.

FIG. 16 is a block diagram illustrating the structure of the read voltage setting component 210 of FIG. 1.

Referring to FIG. 16, the read voltage setting component 210 may include a read voltage determiner 211, a management table 212, and a read operation controller 213.

The read voltage determiner 211 may receive read information (denoted as "Read Info") and provide a read voltage according to environment information (denoted as "Environment Info") stored in the management table 212.

According to an embodiment, the read information may be a physical address corresponding to a read operation to be performed. The read voltage determiner 211 may determine a read voltage according to the stored environment information stored in the management table 212.

The management table 212 may store the environment information stored in the memory device 100 described with reference to FIG. 1. The environment information may be updated by operations of the memory controller 200. The environment information may be stored according to a physical address of memory cells.

A read level provided by the read voltage determiner 211 may include at least one value of the default voltage and the first to fourth offset voltages as described with reference to FIGS. 8 to 15.

According to an embodiment, the read voltage determiner 211 may determine the first offset voltage as the read level when physical addresses corresponding to a read request are sequential addresses. Alternatively, the read voltage determiner 211 may determine the first offset voltage as a read level when a memory device to perform a read operation is set to perform a cache read operation in response to the read request.

According to an embodiment, before a reference time passes after the previous program operation is performed on the physical address corresponding to the current read request, the read voltage determiner 211 may provide, as the read level, the second offset voltage determined according to an elapsed time corresponding to a time which has passed since the previous program operation was performed.

According to an embodiment, when a temperature difference between when a previous program operation is performed on a physical address corresponding to the current read request and when the current read operation is performed is greater than a reference temperature, the read voltage determiner 211 may provide the third offset voltage determined according to the temperature difference as a read level.

According to an embodiment, the read voltage determiner 211 may provide a fourth offset voltage as a read level when a page corresponding to a physical address corresponding to the current read request is included in an unselected block in a previous operation.

According to various embodiments, when a plurality of offset voltages are determined as a read level, the read voltage determiner 211 may provide a sum of the offset voltages as a final read voltage. Alternatively, the read voltage determiner 211 may provide the offset voltage having the largest voltage level, among the plurality of offset voltages, as the final read voltage.

The read voltage determiner 211 may provide the default voltage as a read level when the first to fourth offset voltages are not applied to the read operation.

The read operation controller 213 may provide a command for performing a read operation according to the read level provided by the read voltage determiner 211. The provided command may be provided to the memory device 100.

According to an embodiment, the read operation controller 213 may provide a read voltage set command for setting a read voltage by applying the determined read level to the default read voltage.

Figure 17:
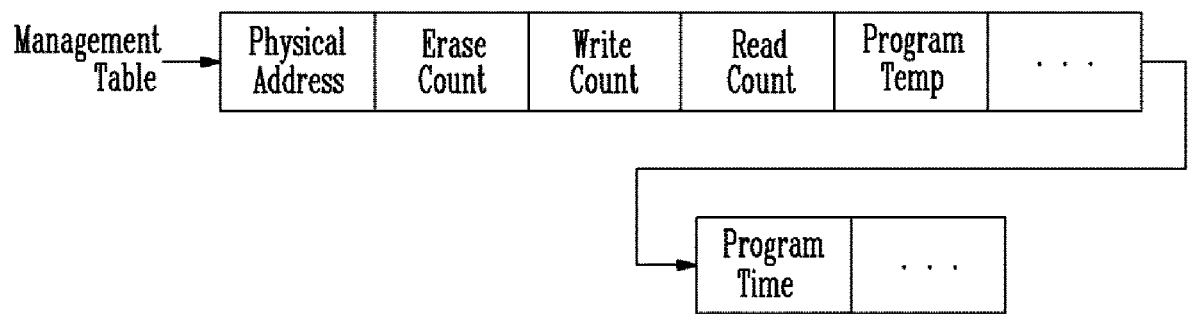
FIG. 17 is a diagram illustrating a management table of FIG. 16.

FIG. 17 is a diagram illustrating the management table 212 of FIG. 16.

Referring to FIG. 17, the management table 212 may store the environment information. According to an embodiment, the management table 212 may be stored in the buffer memory 300 described above with reference to FIG. 1. In addition, the management table 212 may be periodically or randomly stored in the memory device 100.

The management table 212 may store the environment information (denoted as "Environment Info" in FIG. 16) about the memory cells included in the memory device 100 described with reference to FIG. 1. The environment information may be updated by operations of the memory controller 200. The environment information may be stored according to a physical address of the memory cells. More specifically, the environment information may include an erase count, a write count, a read count, and a program temperature during a program operation according to each physical address. Though not shown in FIG. 17, according to an embodiment, the environment information may further include information about a time taken to perform program (denoted as "Program Time"), information indicating whether a cache read operation is supported or not, etc. According to various embodiments, the environment information may be managed in units of memory blocks, pages, and planes.

Figure 18:
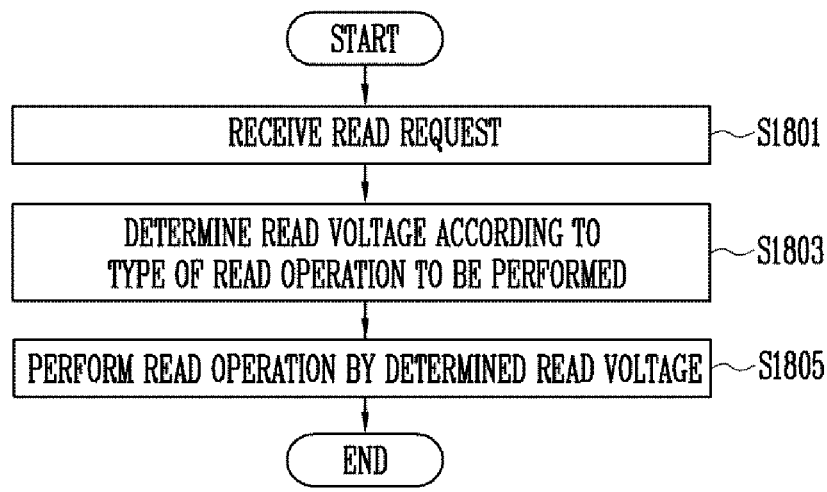
FIG. 18 is a flowchart describing operations of a memory controller according to an embodiment.

FIG. 18 is a flowchart describing operations of a memory controller, for example the memory controller 200 of FIG. 1, according to an embodiment.

Referring to FIG. 18, at step S1801, the memory controller 200 may receive a read request from a host 400. The memory controller 200 may convert a logical address corresponding to the read request into a physical address.

At step S1803, the memory controller 200 may determine a read voltage according to a type of a read operation to be performed. For example, the memory controller 200 may determine a cache read voltage obtained by adding a first offset voltage to a default read voltage as a read voltage when physical addresses corresponding to the read request are sequential addresses.

For another example, when a reference time has not yet elapsed after a previous program operation was performed on a physical address corresponding to the current read request, the memory controller 200 may determine a short-time read voltage obtained by adding a second offset voltage, determined according to an elapsed time corresponding to a time which has passed after the previous program operation was performed, to a default read voltage as a read voltage.

For another example, when a temperature difference between when the previous program operation is performed on a physical address corresponding to the current read request and when a current read operation is to be performed is greater than a reference temperature, the memory controller 200 may determine a cross temperature read voltage obtained by adding a third offset voltage, determined by the temperature difference, to the default read voltage as the read voltage.

For another example, when a page of the physical address corresponding to the current read request is included in an unselected block in a previous operation, the memory controller 200 may determine a first page read voltage obtained by adding a fourth offset voltage to the default read voltage as the read voltage.

At step S1805, the memory controller 200 may control the memory device 100 to perform the read operation using the read voltage determined at step S1803.

Figure 19:
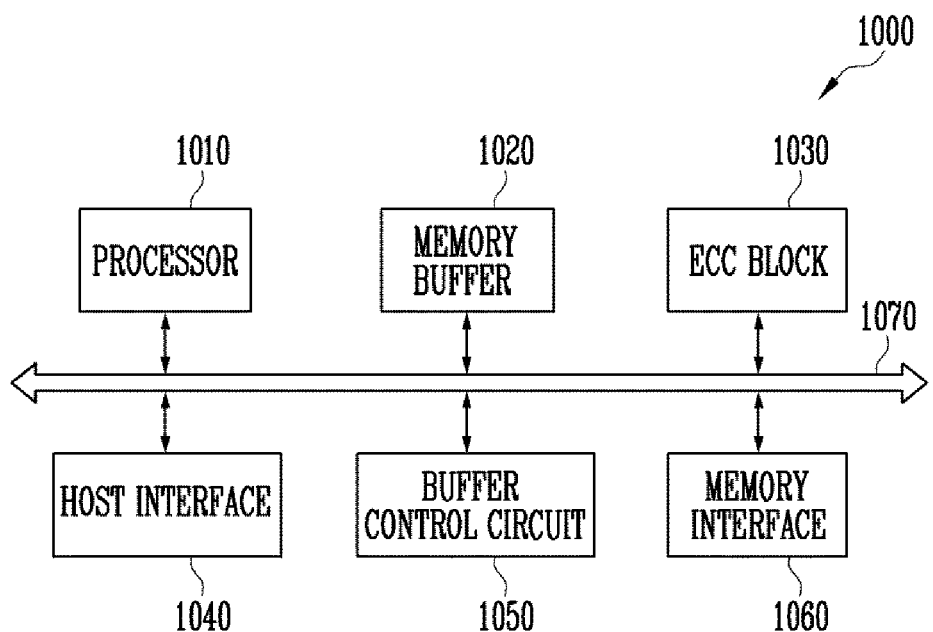
FIG. 19 is a diagram illustrating an embodiment of the memory controller of FIG. 1.

FIG. 19 is a diagram illustrating another embodiment of the memory controller 200 of FIG. 1.

A memory controller 1000 may be coupled to a host and a memory device. In response to a request from the host, the memory controller 1000 may access the memory device. For example, the memory controller 1000 may be configured to control write, read, erase, and background operations of the memory device. The memory controller 1000 may provide an interface between the memory device and the host. The memory controller 1000 may be configured to drive firmware for controlling the memory device.

Referring to FIG. 19, the memory controller 1000 may include a processor 1010, a memory buffer 1020, an error correction code (ECC) block 1030, a host interface 1040, a buffer control circuit 1050, a memory interface 1060, and a bus 1070.

The bus 1070 may provide channels between components of the memory controller 1000.

The processor 1010 may control the overall operation of the memory controller 1000 and perform a logical operation. The processor 1010 may communicate with an external host through the host interface 1040 and communicate with the memory device through the memory interface 1060. Further, the processor 1010 may communicate with the memory buffer 1020 through the buffer control circuit 1050. The processor 1010 may control operations of the storage device by using the memory buffer 1020 as a working memory, a cache memory or a buffer memory.

The processor 1010 may perform the function of a flash translation layer (FTL). The processor 1010 may translate a logical block address (LBA), provided by the host, into a physical block address (PBA) through the flash translation layer FTL. The flash translation layer FTL may receive the logical block address LBA and translate the logical block address LBA into the physical block address PBA by using a mapping table. There may be various address mapping methods for the flash translation layer FTL, depending on a mapping unit. Typical address mapping methods may include a page mapping method, a block mapping method and a hybrid mapping method.

The processor 1010 may randomize data received from the host. For example, the processor 1010 may use a randomizing seed to randomize data received from the host. The randomized data may be provided, as data to be stored, to the memory device and may be programmed in the memory cell array.

The processor 1010 may derandomize data received from the memory device during a read operation. For example, the processor 1010 may derandomize the data received from the memory device using a derandomizing seed. The derandomized data may be output to the host.

According to an embodiment, the processor 1010 may run software or firmware to perform randomizing and derandomizing operations.

The memory buffer 1020 may serve as an operation memory, a cache memory, or a buffer memory of the processor 1010. The memory buffer 1020 may store codes and commands executed by the processor 1010. The memory buffer 1020 may store data that is processed by the processor 1010. The memory buffer 1020 may include a static RAM (SRAM) or a dynamic RAM (DRAM).

The ECC block 1030 may perform error correction. The ECC block 1030 may perform ECC encoding based on data to be written to the memory device through the memory interface 1060. The ECC-encoded data may be transferred to the memory device through the memory interface 1060. The ECC block 1030 may perform ECC decoding based on data received from the memory device through the memory interface 1060. For example, the ECC block 1030 may be included as the component of the memory interface 1060 in the memory interface 1060.

The host interface 1040 may communicate with the external host under the control of the processor 1010. The host interface 1040 may perform communication using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

The buffer control circuit 1050 may control the memory buffer 1020 under the control of the processor 1010.

The memory interface 1060 may communicate with the memory device under the control of the processor 1010. The memory interface 1060 may transmit/receive commands, addresses, and data to/from the memory device through channels.

For example, the memory controller 1000 may not include the memory buffer 1020 and the buffer control circuit 1050.

In an embodiment, the processor 1010 may control the operation of the memory controller 1000 using codes. The processor 1010 may load codes from a nonvolatile memory device (e.g., ROM) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as commands or addresses in the memory controller 1000. The data bus and the control bus may be isolated from each other, and may neither interfere with nor influence each other. The data bus may be coupled to the host interface 1040, the buffer control circuit 1050, the ECC block 1030, and the memory interface 1060. The control bus may be coupled to the host interface 1040, the processor 1010, the buffer control circuit 1050, the memory buffer 1020, and the memory interface 1060.

Figure 20:
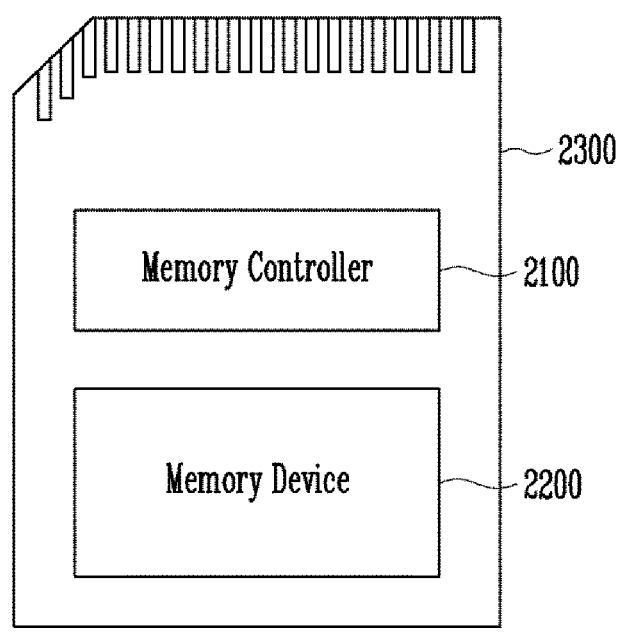
FIG. 20 is a block diagram illustrating a memory card system to which a storage device according to an embodiment is applied.

FIG. 20 is a block diagram illustrating a memory card system 2000 to which a storage device according to an embodiment is applied.

Referring to FIG. 20, the memory card system 2000 may include a memory controller 2100, a memory device 2200, and a connector 2300.

The memory controller 2100 may be coupled to the memory device 2200. The memory controller 2100 may access the memory device 2200. For example, the memory controller 2100 may control read, write, erase, and background operations of the memory device 2200. The memory controller 2100 may be configured to provide an interface between the memory device 2200 and the host. The memory controller 2100 may be configured to drive firmware for controlling the memory device 2200. The memory controller 2100 may have the same configuration as the memory controller 200 described above with reference to FIG. 1.

In an embodiment, the memory controller 2100 may include components, such as a Random Access Memory (RAM), a processor, a host interface, a memory interface, and an ECC block.

The memory controller 2100 may communicate with an external device through the connector 2300. The memory controller 2100 may communicate with an external device (e.g., host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) protocols.

In an embodiment, the connector 2300 may be defined by at least one of the above-described various communication protocols.

In an embodiment, the memory device 2200 may be implemented as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), a Spin-Torque Magnetic RAM (STT-MRAM).

The memory controller 2100 and the memory device 2200 may be integrated into a single semiconductor device to form a memory card. For example, the memory controller 2100 and the memory device 2200 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

Figure 21:
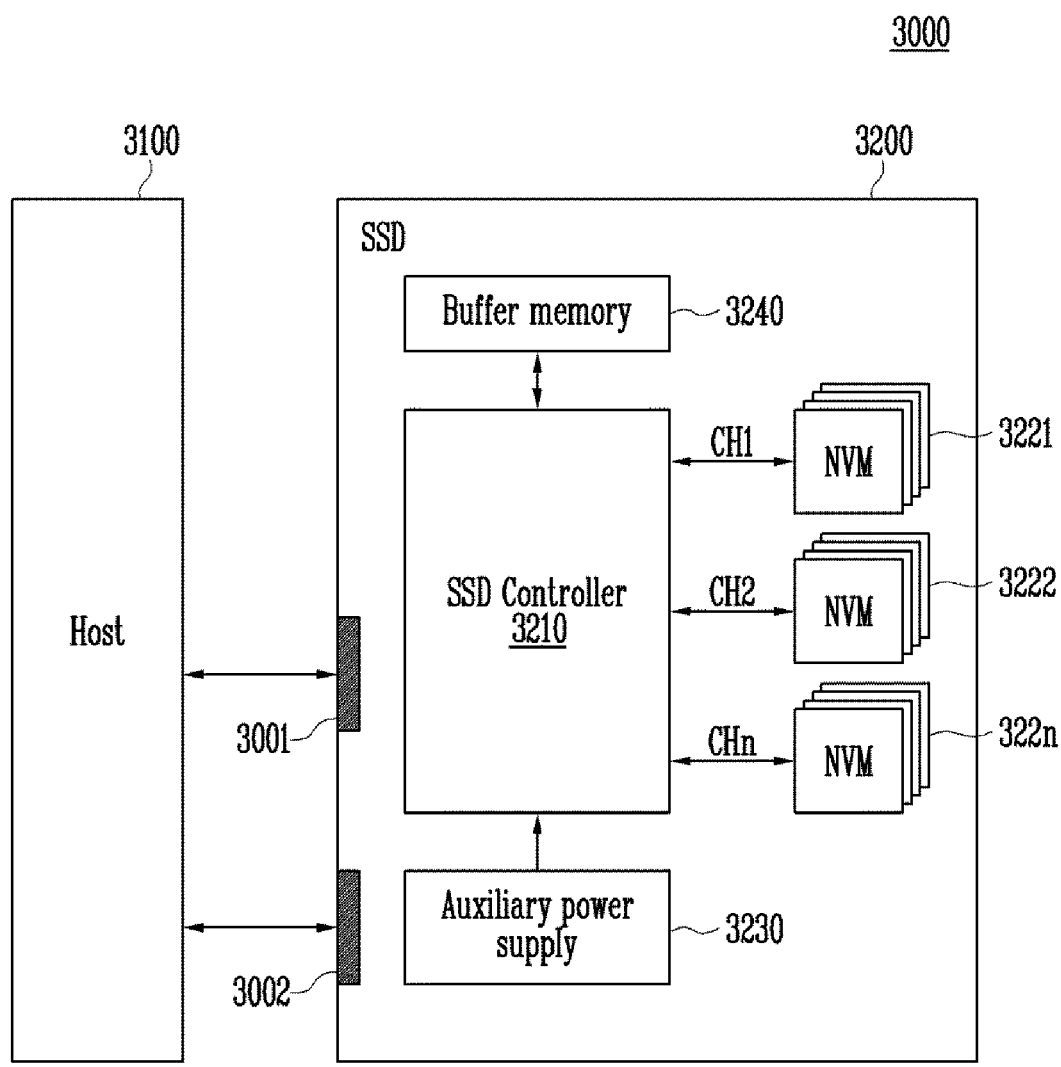
FIG. 21 is a block diagram illustrating an example of a solid state drive (SSD) system to which a storage device according to an embodiment is applied.

FIG. 21 is a block diagram illustrating an example of a solid state drive (SSD) system to which a storage device according to an embodiment is applied.

Referring FIG. 21, an SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200 described above with reference to FIG. 1.

The SSD controller 3210 may control the plurality of flash memories 3221 to 322n in response to the signals SIG received from the host 3100. In an embodiment, the signals SIG may be signals based on the interfaces of the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 3230 may be coupled to the host 3100 through the power connector 3002. The auxiliary power supply 3230 may be supplied and charged with power PWR from the host 3100. The auxiliary power supply 3230 may supply the power of the SSD 3200 when power is not smoothly supplied from the host 3100. In an embodiment, the auxiliary power supply 3230 may be positioned inside or outside the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n or may temporarily store metadata (e g, mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 22:
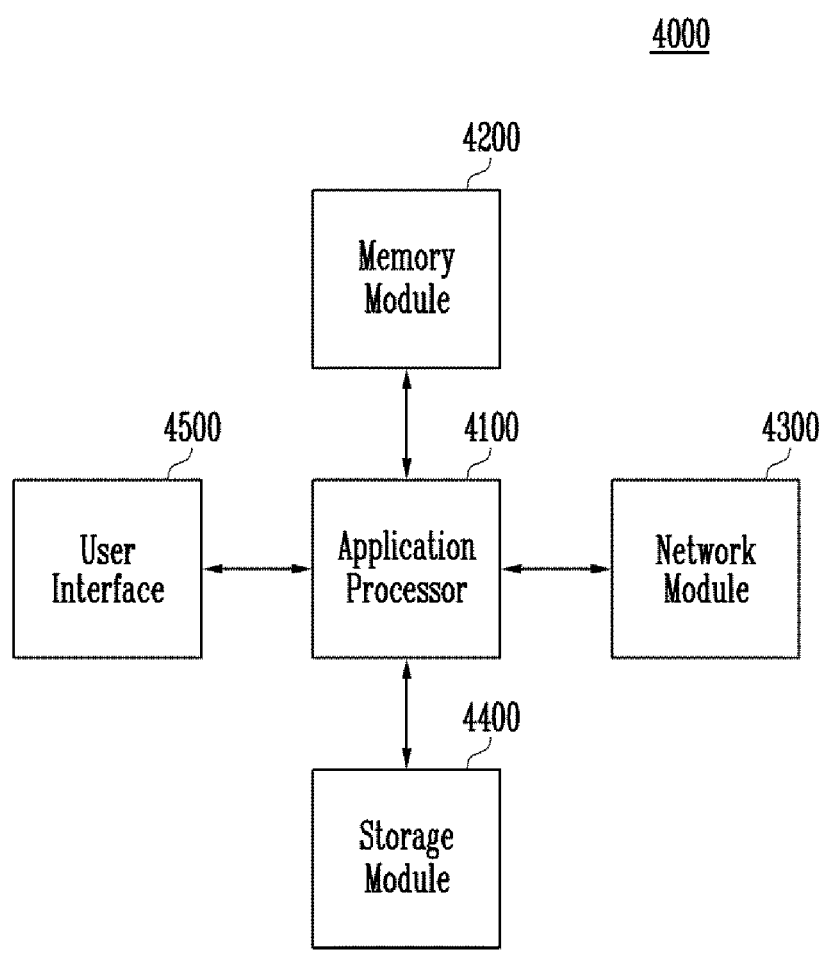
FIG. 22 is a block diagram illustrating a user system to which a storage device according to an embodiment is applied.

FIG. 22 is a block diagram illustrating a user system to which the storage device according to an embodiment of the present disclosure is applied.

Referring to FIG. 22, a user system 4000 may include an application processor 4100, a memory module 4200, a network module 4300, a storage module 4400, and a user interface 4500.

The application processor 4100 may run components included in the user system 4000, an Operating System (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs such as DRAM, SDRAM, DDR SDRAM, DDR2 SDRAM, DDR3 SDRAM, LPDDR SDARM, LPDDR2 SDRAM, and LPDDR3 SDRAM or nonvolatile RAMs such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. In an embodiment, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 400.

For example, the storage module 4400 may include a plurality of non-volatile memory devices, and the plurality of non-volatile memory devices may operate in the same manner as the memory device described above with reference to FIGS. 2 to 5. The storage module 4400 may be operated in the same manner as the storage device 50 described above with reference to FIG. 1.

The user interface 4500 may include interfaces which input data or instructions to the application processor 4100 or output data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a motor.

According to the present disclosure, a storage device performing a read operation using a read voltage set according to environment where the read operation is performed, and an operating method thereof may be provided.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

It will be apparent to those skilled in the art that various modifications can be made to the above-described exemplary embodiments of the present invention without departing from the spirit or scope of the invention.

Thus, it is intended that the present invention cover all such modifications provided they come within the scope of the appended claims and their equivalents.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the accompanying claims and equivalents thereof.

What is claimed is:

1. A storage device, comprising:
   a memory device configured to include a plurality of memory blocks; and
   a memory controller configured to provide the memory device with information on levels of an offset voltage according to a type of a read operation to be performed among a plurality of read operations and to transmit a read command instructing the memory device to perform a read operation on selected memory cells included in the plurality of memory blocks using read voltages obtained by applying the offset voltage to default read voltages of the memory device,
   wherein the plurality of read operations include a cache read operation, a short-time read operation, a cross temperature read operation, or a first page read operation.

2. The storage device of claim 1, wherein the memory controller provide information including a level of a first offset voltage if the cache read operation is to be performed by the memory device.

3. The storage device of claim 2, wherein the first offset voltage has a positive voltage value greater than 0 V.

4. The storage device of claim 1, wherein the memory controller provide information including a level of a second offset voltage if the short-time read operation is to be performed by the memory device.

5. The storage device of claim 4, wherein the short-time read operation is performed before a preset reference time elapses from when a program operation for the selected memory cells is completed.

6. The storage device of claim 5, wherein the level of the second offset voltage is determined according to a time elapsed from when the program operation is completed until the short time read operation is performed.

7. The storage device of claim 1, wherein the memory controller provide information including a level of a third offset voltage if the cross temperature read operation is to be performed by the memory device.

8. The storage device of claim 7, wherein the level of the third offset voltage is determined according to a difference between a temperature when the program operation is completed and a temperature when the read operation is performed.

9. The storage device of claim 7, wherein the level of the third offset voltage is positive if a temperature when the program operation is completed is greater than a temperature when the read operation is performed.

10. The storage device of claim 1, wherein the memory controller provide information including a level of a fourth offset voltage if the first page read operation is to be performed by the memory device.

11. The storage device of claim 7, wherein the first page read operation is performed when a memory block including the selected memory cells was an unselected memory block in the previous operation before the read operation.

12. The storage device of claim 11, wherein the fourth offset voltage has a positive voltage value greater than 0 V.

13. A method of operating a storage device comprising a memory device and a memory controller controlling the memory device, wherein the memory device includes a plurality of memory cells, the method comprising:
    receiving a read request with respect to selected memory cells, among the plurality of memory cells;
    obtaining levels of an offset voltage according to a type of a read operation to be performed among a plurality of read operations by the memory device based on an environment information;
    calculating read voltages to be used for the read operation by applying the offset voltage to default read voltages of the memory device;
    performing the read operation using the read voltages,
    wherein the plurality of read operations include a cache read operation, a short-time read operation, a cross temperature read operation, or a first page read operation.

14. The operating method of claim 13,
    wherein the obtaining comprises determining a first offset voltage as the offset voltage when the read operation is the cache read operation.

15. The operating method of claim 14,
    wherein the first offset voltage has a positive voltage value greater than 0 V.

16. The operating method of claim 13,
    wherein the obtaining comprises determining a second offset voltage as the offset voltage when the read operation is the short-time read operation.

17. The operating method of claim 16,
    wherein the short-time read operation is performed before a preset reference time elapses from when a program operation for the selected memory cells is completed, and
    wherein the level of the second offset voltage is determined according to a time elapsed from when the program operation is completed until the short time read operation is performed.

18. The operating method of claim 13,
wherein the obtaining comprises determining a third offset voltage when the read operation is the cross temperature read operation, and
wherein the level of the third offset voltage is determined according to a difference between a temperature when the program operation is completed and a temperature when the read operation is performed.

19. The operating method of claim 13,
wherein the obtaining comprises determining a fourth offset voltage when the read operation is the first page read operation, and
wherein the first page read operation is performed when a memory block including the selected memory cells was an unselected memory block in the previous operation before the read operation.

20. A memory system comprising:
a memory device including memory cells;
a storage storing at least one piece of information representing:

whether a read operation to be performed is a cache read operation;
elapsed time after completion of a previous program operation;
temperature of the memory cells during the previous program operation; and
whether a target memory block of the read operation is an unselected block during a previous operation;
a read voltage determiner determining a read voltage for the read operation by referring to the information and selectively based on temperature of the memory cells during the read operation; and
a read operation controller controlling the memory device to perform the read operation with the determined read voltage,
wherein the information is stored in the storage on a basis of physical addresses of the memory cells.

* * * * *